US011865645B2

(12) United States Patent
Saito

(10) Patent No.: US 11,865,645 B2
(45) Date of Patent: Jan. 9, 2024

(54) SOLDERING APPARATUS

(71) Applicant: SENJU METAL INDUSTRY CO., LTD., Tokyo (JP)

(72) Inventor: Yuta Saito, Tokyo (JP)

(73) Assignee: SENJU METAL INDUSTRY CO., LTD., Tokyo (JP)

(*) Notice: Subject to any disclaimer, the term of this patent is extended or adjusted under 35 U.S.C. 154(b) by 0 days.

(21) Appl. No.: 18/033,719

(22) PCT Filed: Jun. 14, 2021

(86) PCT No.: PCT/JP2021/022533
§ 371 (c)(1),
(2) Date: Apr. 25, 2023

(87) PCT Pub. No.: WO2022/102156
PCT Pub. Date: May 19, 2022

(65) Prior Publication Data
US 2023/0356314 A1    Nov. 9, 2023

(30) Foreign Application Priority Data

Nov. 12, 2020    (JP) .................................. 2020-188689

(51) Int. Cl.
*B23K 3/00* (2006.01)
*B23K 3/08* (2006.01)
(Continued)

(52) U.S. Cl.
CPC ............ *B23K 3/085* (2013.01); *B23K 1/0016* (2013.01); *H05K 3/341* (2013.01)

(58) Field of Classification Search
CPC ............. B23K 3/085; B23K 1/00–206; B23K 3/00–087; B23K 2101/36–42; H05K 3/341
(Continued)

(56) References Cited

U.S. PATENT DOCUMENTS 5,172,847 A * 12/1992 Barten .................. B23K 1/0012
228/183
5,172,849 A * 12/1992 Barten .................. B23K 1/0012
432/128
(Continued)

FOREIGN PATENT DOCUMENTS

CN         101048042 A  * 10/2007   ............. B23K 1/008
CN         106793563 A      5/2017
(Continued)

OTHER PUBLICATIONS

International Search Report issued by the Japan Patent Office for corresponding International Patent Application No. PCT/JP2021/022533, dated Aug. 24, 2021, with a partial English translation.

(Continued)

*Primary Examiner* — Kiley S Stoner
(74) *Attorney, Agent, or Firm* — Myers Wolin, LLC

(57) ABSTRACT

A soldering apparatus includes a cooling zone, upper and lower vent holes, an external channel, a blower unit, a heat exchanger, a pair of bypass channels, and a ventilation plate. The vent holes are provided, respectively, above and below a pair of rails configured to transport a board in the cooling zone. The external channel connects the vent holes with each other outside the cooling zone. The blower unit causes gas in the external channel to flow through the upper vent hole, the cooling zone, and the lower vent hole. The heat exchanger is provided in a lower opening linked to the lower vent hole in the cooling zone. The pair of bypass channels deliver gas above the pair of rails to the lower opening while bypassing locations of the pair of rails. The ventilation plate is provided in a space formed between the pair of bypass channels.

8 Claims, 16 Drawing Sheets

(51) Int. Cl.
*B23K 1/00* (2006.01)
*H05K 3/34* (2006.01)

(58) Field of Classification Search
USPC .......................................... 228/179.1–180.22
See application file for complete search history.

(56) References Cited

U.S. PATENT DOCUMENTS

| | | | | |
|---|---|---|---|---|
| 5,195,673 | A * | 3/1993 | Irish | F27B 9/10 |
| | | | | 228/43 |
| 5,271,545 | A * | 12/1993 | Boswell | F27B 9/10 |
| | | | | 228/183 |
| 5,440,101 | A * | 8/1995 | Cox | H05K 13/02 |
| | | | | 34/212 |
| 5,611,476 | A * | 3/1997 | Soderlund | B01D 53/002 |
| | | | | 228/43 |
| 6,382,500 | B1 * | 5/2002 | Master | H01L 24/75 |
| | | | | 228/19 |
| 6,386,422 | B1 * | 5/2002 | Cheng | B23K 1/008 |
| | | | | 432/128 |
| 10,537,031 | B2 * | 1/2020 | Hillman | H01L 21/67144 |
| 2003/0111459 | A1 * | 6/2003 | Nishimura | B23K 1/012 |
| | | | | 219/628 |
| 2012/0240424 | A1 | 9/2012 | Sugihara et al. | |
| 2016/0256946 | A1 * | 9/2016 | Hiyama | H05K 3/3494 |
| 2019/0234342 | A1 * | 8/2019 | Saito | B03C 3/01 |
| 2021/0170514 | A1 * | 6/2021 | Wang | B23K 1/008 |

FOREIGN PATENT DOCUMENTS

| | | | | | |
|---|---|---|---|---|---|
| CN | 108115239 | A | * | 6/2018 | .............. B23K 1/00 |
| CN | 108237296 | A | * | 7/2018 | |
| CN | 110385496 | A | * | 10/2019 | ........... B23K 1/0016 |
| CN | 110385497 | A | * | 10/2019 | |
| CN | 109952818 | B | * | 9/2021 | .............. B23K 1/00 |
| DE | 29902957 | U1 | * | 6/1999 | ............. B23K 1/008 |
| DE | 10392557 | T5 | * | 5/2005 | ............... B23K 3/08 |
| EP | 1029625 | A2 | * | 8/2000 | ............. B23K 1/008 |
| GB | 2375975 | A | * | 12/2002 | ............. B01D 46/02 |
| JP | H05-50218 | A | | 3/1993 | |
| JP | H05261528 | A | * | 10/1993 | |
| JP | H05-87987 | U | | 11/1993 | |
| JP | H07-336040 | A | | 12/1995 | |
| JP | 2559743 | Y2 | | 1/1998 | |
| JP | H10-200253 | A | | 7/1998 | |
| JP | 2003-181682 | A | | 7/2003 | |
| JP | 2004-195476 | A | | 7/2004 | |
| JP | 4100578 | B2 | * | 6/2008 | ............. B23K 1/008 |
| JP | 2011-121101 | A | | 6/2011 | |
| JP | 2018-69264 | A | | 5/2018 | |
| KR | 20120095129 | A | * | 8/2012 | |
| WO | WO-2005068123 | A1 | * | 7/2005 | ............. B23K 1/008 |
| WO | WO-2013038456 | A1 | * | 3/2013 | ............ B23K 1/0008 |
| WO | WO-2014103946 | A1 | * | 7/2014 | ............ B23K 1/0016 |
| WO | WO-2016104710 | A1 | * | 6/2016 | ............. B23K 1/002 |
| WO | WO-2020046959 | A1 | * | 3/2020 | ............. B23K 1/008 |

OTHER PUBLICATIONS

International Preliminary Report on Patentability issued by the Japan Patent Office for corresponding International Patent Application No. PCT/JP2021/022533, dated Feb. 28, 2022, with an English translation.

Office Action issued by the Intellectual Property Office of Korea for corresponding Korean Patent Application No. 10-2023-7013497, dated Jun. 22, 2023, with an English translation.

Office Action issued by the China National Intellectual Property Administration for corresponding Chinese Patent Application No. 202180075797.X, dated Oct. 21, 2023, with an English machine translation.

* cited by examiner

SOLDERING APPARATUS

CROSS-REFERENCE TO RELATED APPLICATION

This application is a National Stage application under 35 U.S.C. 371 of International Application No. PCT/JP2021/022533, filed on Jun. 14, 2021 and designated the U.S., which claims priority to Japanese Patent Application No. 2020-188689, filed on Nov. 12, 2020. The contents of each are herein incorporated by reference.

FIELD

The present disclosure relates to an apparatus used to perform a soldering process.

BACKGROUND

Currently, as a technique for mounting various electronic products (e.g., IC chips) on a circuit board, a soldering process is widely known. With a typical soldering process, first, solder paste is printed in place on a circuit board. Next, electronic products are mounted on the circuit board. Then, the circuit board is heated and cooled in this order in a soldering apparatus called a reflow furnace.

Related techniques for cooling the circuit board include a cooling apparatus disclosed in PTL 1. The related cooling apparatus adopts a scheme for supplying cooling gas from above and below. The related cooling apparatus includes left and right rails for transporting circuit boards, and left and right inlet channels combined with the left and right rails. The inlet channels extend in an up-and-down direction of the cooling apparatus on lateral sides of the left and right rails.

The left and right inlet channels are linked to upper and lower recovery channels. The upper recovery channel recovers cooling gas above the left rail after the cooling gas is blown from above a circuit board and then moved to the left of the circuit board. The lower recovery channel recovers cooling gas below the left rail after the cooling gas is blown from below the circuit board and then moved to the left of the circuit board. The upper recovery channel and the lower recovery channel merge into a single channel downstream of the recovery channels. The right inlet channel is similar in configuration to the left inlet channel.

PTL 2 discloses a cooling apparatus that adopts the same gas supply scheme as PTL 1. PTL 3 discloses a cooling apparatus that uses a scheme of supplying gas from above (down blow scheme). The cooling apparatus of PTL 3 includes cooling fins provided between a stirring fan and rails and configured to cool the gas supplied from above to be blown onto a circuit board. PTL 4 discloses an apparatus by which gas supplied from above is heated using a heater and blown onto a circuit board.

CITATION LIST

Patent Literature

[PTL 1] JP 2004-195476 A
[PTL 2] JP 2003-181682 A
[PTL 3] Japanese Utility Model Registration No. 2559743
[PTL 4] JP H10-200253 A

SUMMARY

Technical Problem

A case will now be considered in which two or more circuit boards are cooled by being transported successively on the cooling apparatus of PTL 1. In this case, part of the cooling gas supplied from above the cooling apparatus is expected to move to below the cooling apparatus through a gap between two adjacent circuit boards. Conversely, part of the cooling gas supplied from below the cooling apparatus is expected to move to above the cooling apparatus.

Then, a flow of the cooling gas is disturbed in places where different flows of gas collide with each other, and consequently oxygen gas may flow in from outside the reflow furnace. This problem can also occur with the cooling apparatus of PTL 2. With the cooling apparatus of PTL 3, the cooling gas moves to above a cooling zone in places where a circuit board is present, but otherwise moves to below the cooling zone. Therefore, a state of circulation of the cooling gas in the cooling zone varies greatly depending on the presence or absence of a circuit board, and the above-mentioned inflow of oxygen gas from outside the furnace may occur. The oxygen gas from outside the furnace might cause oxidation of a soldering area. Thus, there is demand for improvements intended to cool the soldering area while curbing disturbances in the flow of cooling gas in the cooling apparatus.

With the cooling apparatus of PTL 1, the channel resulting from the merging of the upper and lower recovery channels is formed outside the cooling zone. Consequently, the cooling gas flowing through the resulting channel may be cooled by an inner wall surface of the resulting channel. When the cooling gas is cooled by the inner wall surface, there may arise a trouble in which flux contained in the cooling gas will condense and attach to the inner wall surface. Thus, there is demand for improvements also from the viewpoint of curbing liquefaction of flux in the cooling zone and thereby improving flux recovery efficiency outside the cooling zone.

An object of the present disclosure is to provide a soldering apparatus capable of curbing disturbances in flow of cooling gas in a cooling apparatus when two or more circuit boards are cooled by being transported successively. Another object of the present disclosure is to provide a soldering apparatus capable of improving recovery efficiency for flux contained in cooling gas outside a cooling zone.

Solution to Problem

A first disclosure is a soldering apparatus that has the following features.

The soldering apparatus comprises a cooling zone, an upper vent hole, a lower vent hole, an external channel, a blower unit, a heat exchanger, a pair of bypass channels, and a ventilation plate.

The cooling zone cools a board subjected to a soldering process.

The upper vent hole is provided above a pair of rails configured to transport the board in the cooling zone.

The lower vent hole is provided below the pair of rails in the cooling zone.

The external channel connects the upper and lower vent holes with each other outside the cooling zone.

The blower unit is communicated with the upper vent hole. The blower unit causes gas in the external channel to flow through the upper vent hole, the cooling zone, and the lower vent hole in order and return to the external channel.

The heat exchanger is provided in a lower opening linked to the lower vent hole below the pair of rails. The heat exchanger cools gas passing through the lower opening.

The pair of bypass channels are provided in parallel to the pair of rails on lateral sides of the pair of rails. The bypass channels deliver gas above the pair of rails to the lower opening while bypassing locations of the pair of rails.

The ventilation plate is provided in a space formed between the pair of bypass channels below the pair of rails. The ventilation plate has a slit used to send gas below the pair of rails to the lower opening.

According to a second disclosure, the first disclosure further has the following features.

The pair of bypass channels each include an inlet port, a discharge port, and a bend, the inlet ports being located above the pair of rails, the discharge ports being located below the ventilation plate, the bends bending outward from inside the pair of rails in the locations of the pair of rails.

The discharge ports are located below the ventilation plate and above the lower opening.

According to a third disclosure, the first or second disclosure further has the following features.

The pair of bypass channels each include an inlet port, a discharge port, and a bend, the inlet ports being located above the pair of rails, the discharge ports being located below the ventilation plate, the bends bending outward from inside the pair of rails in the locations of the pair of rails.

One of the inlet ports faces another of the inlet ports.

One of the discharge ports faces another of the discharge ports.

According to a fourth disclosure, any one of the first to third disclosures further has the following features.

A width of the pair of bypass channels in a transport direction of the board is approximately equal to a width of the ventilation plate in the transport direction.

The slit is formed in a direction orthogonal to the transport direction of the board.

According to a fifth disclosure, any one of the first to fourth disclosures further has the following features.

The upper vent hole is provided in a furnace side wall surface serving as a side wall surface of the cooling zone.

The blower unit includes a blower fan, a fan inlet zone, and a fan outlet zone. The blower fan is provided on a furnace ceiling wall surface serving as a ceiling wall surface of the cooling zone. The fan inlet zone extends from the upper vent hole to a wall surface facing the furnace side wall surface, and causes gas to flow toward the blower fan from the upper vent hole. The fan outlet zone is provided surrounding the fan inlet zone and causes gas to flow toward the cooling zone from the blower fan.

According to a sixth disclosure, the fifth disclosure further has the following features.

An outlet zone bottom wall surface serving as a bottom wall surface of the fan outlet zone faces a board transport surface formed between the pair of rails. A large number of vent holes are formed at equal intervals in the outlet zone bottom wall surface.

According to a seventh disclosure, any one of the first to sixth disclosures further has the following features.

The soldering apparatus further comprises a branch channel and a recovery unit.

The branch channel branches off from the external channel at a midpoint of the external channel.

The recovery unit is connected to the branch channel. The recovery unit recovers flux in a liquid state.

According to an eighth disclosure, the seventh disclosure further has the following features.

The recovery unit includes a storage and a connector connecting the storage to the branch channel.

A branch point of the branch channel in the external channel is located directly below the lower vent hole.

The storage is provided below the branch point.

A channel connecting the branch point and the storage with each other is inclined downward from the branch point to the storage.

Advantageous Effects

According to the first disclosure, when a board is present above the heat exchanger, much of the gas above the pair of rails can be delivered to the heat exchanger through the pair of bypass channels. On the other hand, when no board is present above the heat exchanger, much of the gas above the pair of rails can be sent to the heat exchanger through the slit. Thus, when two or more boards are transported successively, it is possible to cool the boards while curbing disturbances in the flow of gas existing between the pair of rails.

According to the second disclosure, since the discharge ports are located below the ventilation plate and above the lower opening, length of the bypass channels can be shortened. By shortening the length of the bypass channels, it is possible to supply gas to the heat exchanger while keeping the gas flowing through the bypass channels from being cooled by inner wall surfaces of the bypass channels. This makes it possible to cool the gas passing through the bypass channels reliably in the heat exchanger and thereby efficiently recover the flux contained in the gas downstream of the heat exchanger.

According to a third disclosure, when a board is present above the heat exchanger, much of gas flowing to lateral sides of the board can be drawn in through the inlet ports and discharged to below the ventilation plate through the bends and the discharge ports. The gas discharged to below the ventilation plate merges with gas passing through the slit. This can cause disturbances of gas below the ventilation plate. However, because the disturbances are blocked by the ventilation plate, the flow of the gas existing between the pair of rails is rarely disturbed. Thus, it is possible to cool the boards while curbing disturbances in the flow of gas existing between the pair of rails.

Spacing between the pair of rails is adjusted according to size of the boards. That is, the spacing is increased when boards having a large width in the direction orthogonal to the transport direction are cooled, and the spacing is reduced when boards having a small width are cooled. Consequently, if the slit is formed in parallel to the transport direction, disturbances in the flow of gas may increase around the slit depending on the spacing between the pair of rails. In this respect, according to the fourth disclosure, since the slit is formed in the direction orthogonal to the transport direction, occurrence of troubles with adjustment of the spacing between the pair of rails can be reduced compared to when the slit is formed in parallel to the transport direction.

According to the fifth disclosure, the gas flowing into the blower unit from the external channel through the upper vent hole can be sent out to the cooling zone by flowing through the fan inlet zone, the blower fan, and the fan outlet zone in this order. Here, the upper vent hole is provided in the furnace side wall surface. The blower fan is provided in the furnace ceiling wall surface. The fan outlet zone is provided surrounding the fan inlet zone. Therefore, such a relative arrangement allows an orientation of the gas flowing into the blower unit through the furnace side wall surface to be changed in the blower unit and thereby allows the gas sent out from the blower unit to be orientated in a single direction moving from above to below the cooling zone. This makes it possible to stabilize the flow of gas existing between the pair of rails.

According to the sixth disclosure, a large number of vent holes are formed at equal intervals in the outlet zone bottom wall surface facing the board transport surface. Consequently, the gas flowing into the blower unit during operation of the blower unit can be moved toward the board transport surface by blowing out uniformly through the vent holes. This makes it possible to further stabilize the flow of gas existing between the pair of rails.

According the seventh disclosure, the flux in a liquid state produced by being condensed in the heat exchanger can be recovered by the recovery unit outside the cooling zone through the external channel and the branch channel.

According to the eighth disclosure, the channel connecting the branch point and the storage with each other is inclined downward from the branch point to the storage. This makes it possible to improve the efficiency with which the flux in a liquid state is recovered outside the cooling zone by the recovery unit.

DESCRIPTION OF EMBODIMENTS

A soldering apparatus (hereinafter also referred to as a "reflow furnace") according to an embodiment of the present disclosure will be described below with reference to the drawings. Note that components common among different drawings will be denoted by the same reference sings, and redundant description thereof will be omitted. Also, the present disclosure is not limited by the embodiment described below.

1. Overall Configuration Example of Reflow Furnace

Figure 1:
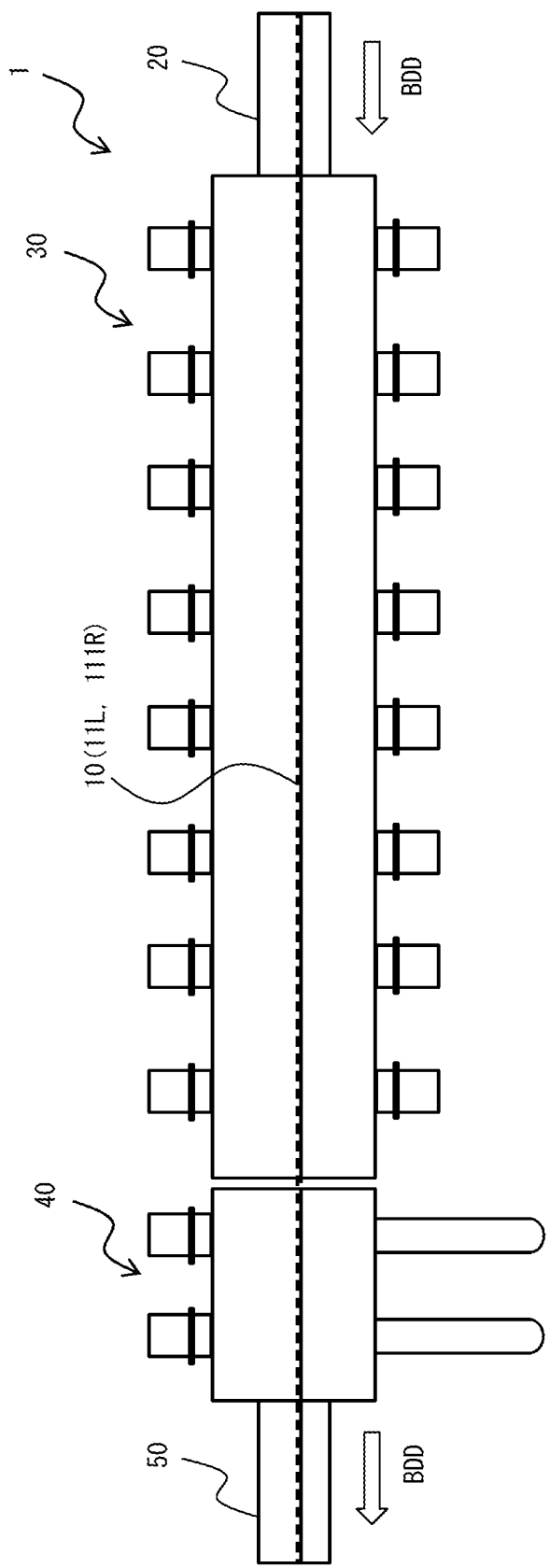
FIG. 1 is a diagram showing an overall configuration example of a soldering apparatus according to an embodiment of the present disclosure.

FIG. 1 is a diagram showing an overall configuration example of a reflow furnace according to an embodiment of the present disclosure. The reflow furnace 1 shown in FIG. 1 includes a conveyor 10. The conveyor 10 includes a pair of rails 11L and 11R placed along a longitudinal direction of the reflow furnace 1, and transports circuit boards CB (see FIG. 4) mounted between the rails 11L and 11R in a transport direction BDD. Spacing between the rails 11L and 11R is adjusted according to size of the circuit boards CB. Solder paste is printed in place on the circuit board CB. Also, electronic products are mounted on the circuit board CB. A solder paste printing process and an electronic product mounting process are performed before a soldering process performed in the reflow furnace 1.

The reflow furnace 1 also includes labyrinths 20 and 50. The labyrinth 20 is provided at an inlet of the reflow furnace 1. The labyrinth 20 has an internal structure that is made up of plural fin-like metal plates and the like. The internal structure prevents infiltration of outside air through the inlet of the reflow furnace 1. The labyrinth 50 is provided at the inlet of the reflow furnace 1. The labyrinth 50 is provided for the purpose of preventing infiltration of outside air through the outlet of the reflow furnace 1.

The reflow furnace 1 further includes a heating zone 30. The heating zone 30 includes, for example, preheating zones and peak heating zones. In the example shown in FIG. 1, five zones on the inlet side (i.e., on the side of the labyrinth 20) correspond to the former and the remaining three zones on the outlet side (i.e., on the side of the labyrinth 50) correspond to the latter. However, the numbers of preheating zones and peak heating zones vary with the type of reflow furnace 1.

In the preheating zone, circuit boards CB are heated in a relatively low temperature range. As a result of the heating in the preheating zone, the flux contained in the solder paste starts to evaporate. In the peak heating zone, the circuit boards CB are heated in a temperature range in which a solder component contained in the solder paste melts. The range of the preheating temperature and the range of the peak heating temperature are set appropriately according to solder component composition. Evaporation of the flux occurs not only in the preheating zone, but also in the peak heating zone. As the circuit boards CB are heated in the peak heating zone, the volatile components in the flux evaporate.

The reflow furnace 1 further includes a cooling zone 40. In the example shown in FIG. 1, the cooling zone 40 is divided into first and second zones. However, the total number of cooling zones 40 varies with the type of reflow furnace 1. Therefore, the total number of cooling zones 40 may be 1. In the cooling zone 40, circuit boards CB are cooled. As the circuit boards CB are cooled in the cooling zone 40, the solder component solidifies.

The cooling zone 40 is linked to the heating zone 30. Consequently, part of the volatile components of the flux evaporating in the heating zone 30 flows into the cooling zone 40. A configuration example of the cooling zone 40 and cooling operation for circuit boards CB in the cooling zone 40 will be described below.

2. Cooling Zone

2-1. Configuration Example

Figure 2:
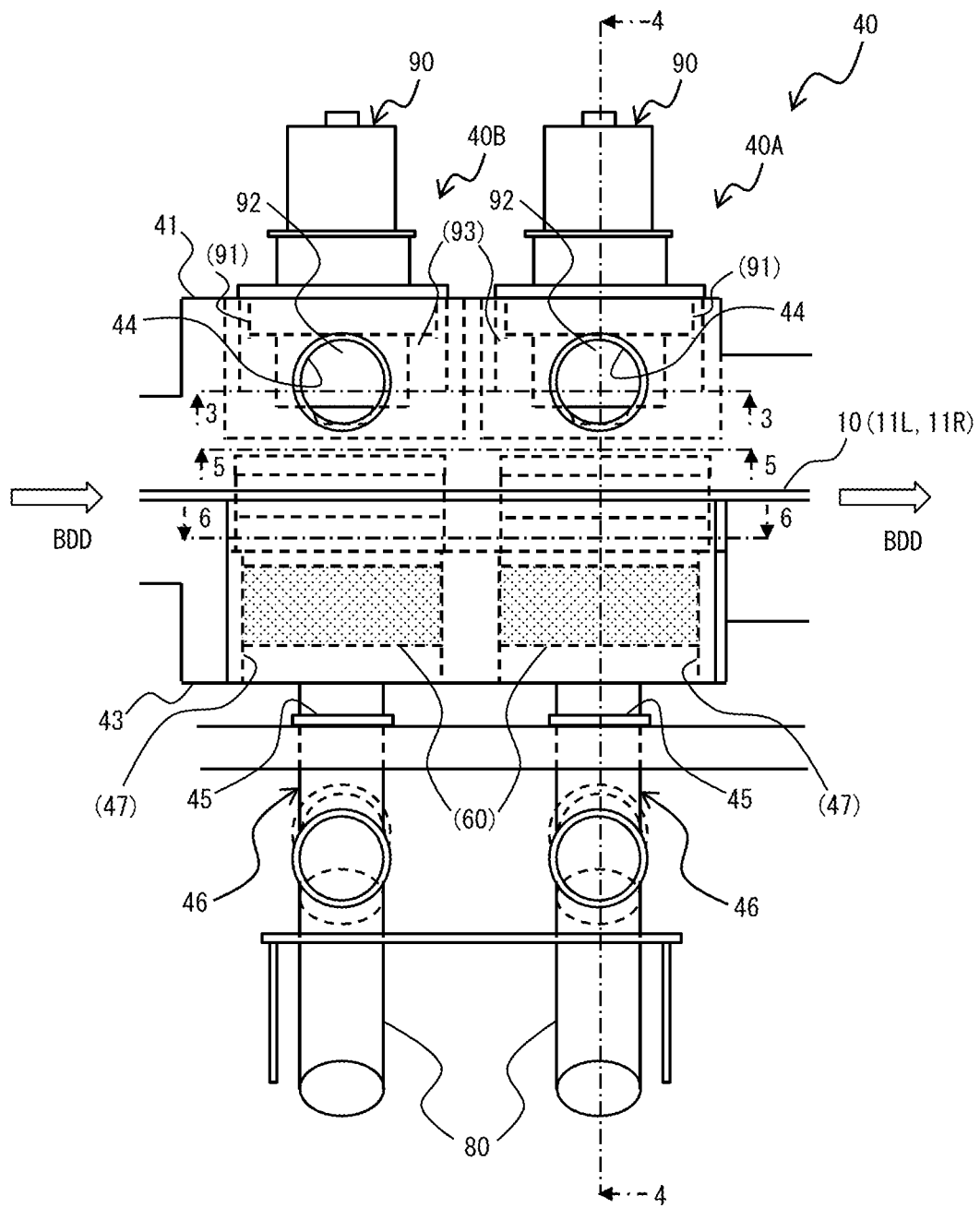
FIG. 2 is a diagram showing an example of major components of a cooling zone shown in FIG. 1.

FIG. 2 is a diagram showing an example of major components of the cooling zone 40 shown in FIG. 1. As shown in FIG. 2, the cooling zone 40 includes a cooling zone 40A and a cooling zone 40B. The cooling zone 40A and the cooling zone 40B are basically equal in configuration. Therefore, the cooling zone 40A will be described below representatively, and description of the cooling zone 40B will be omitted.

Figure 3:
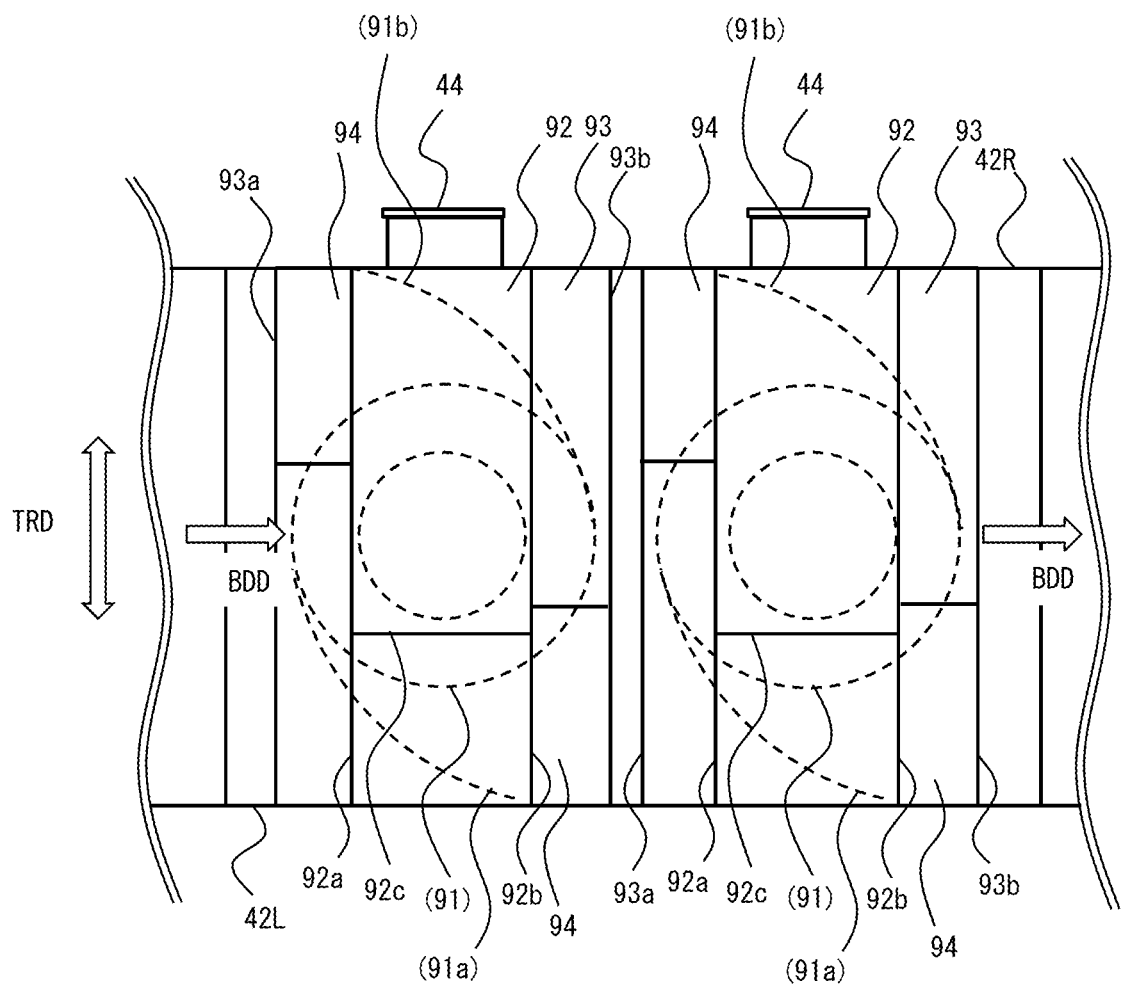
FIG. 3 is a diagram showing an upper part of the cooling zone as viewed from the side of a conveyor when the cooling zone is cut along line 3-3 in FIG. 2.
Figure 4:
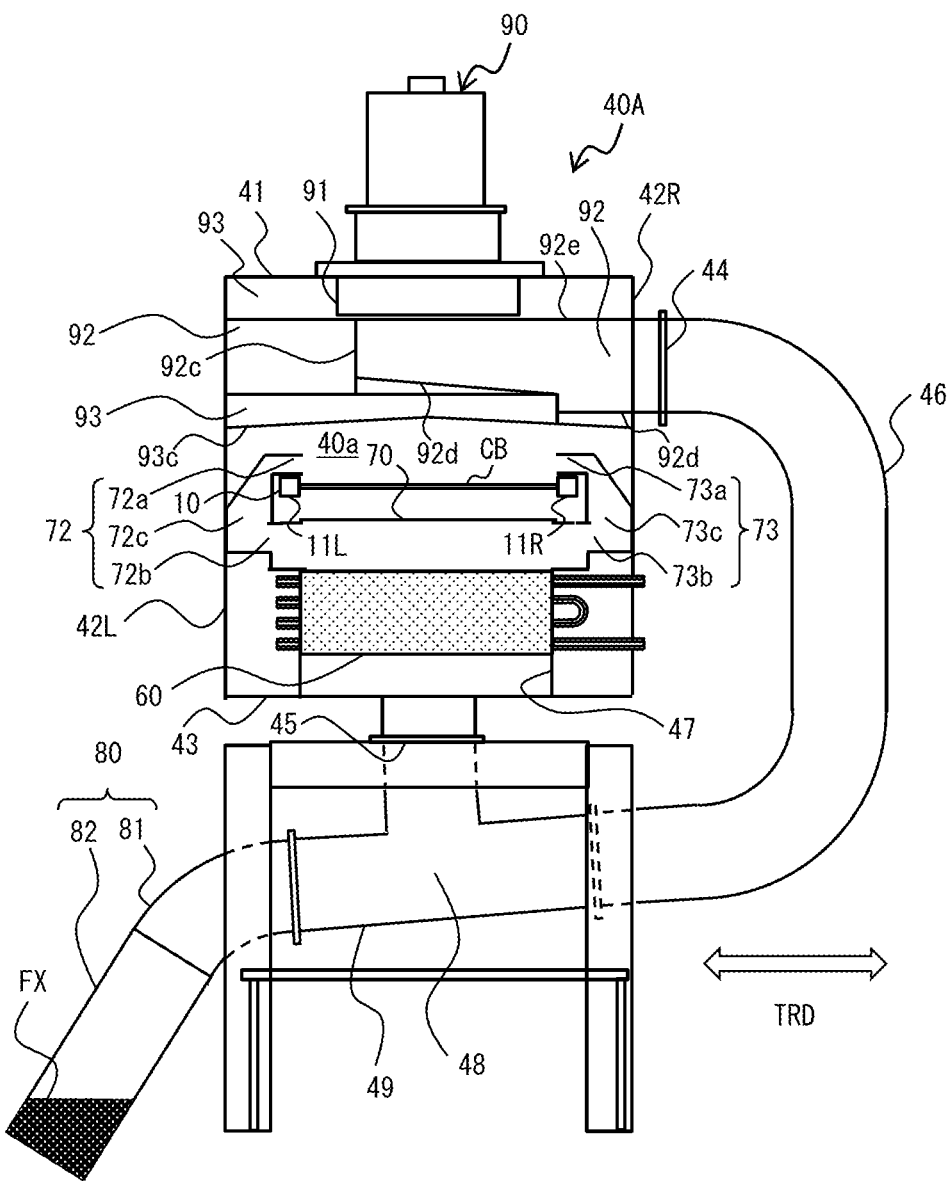
FIG. 4 is a diagram showing the cooling zone as viewed from the side of a heating zone when the cooling zone is cut along line 4-4 in FIG. 2.
Figure 5:
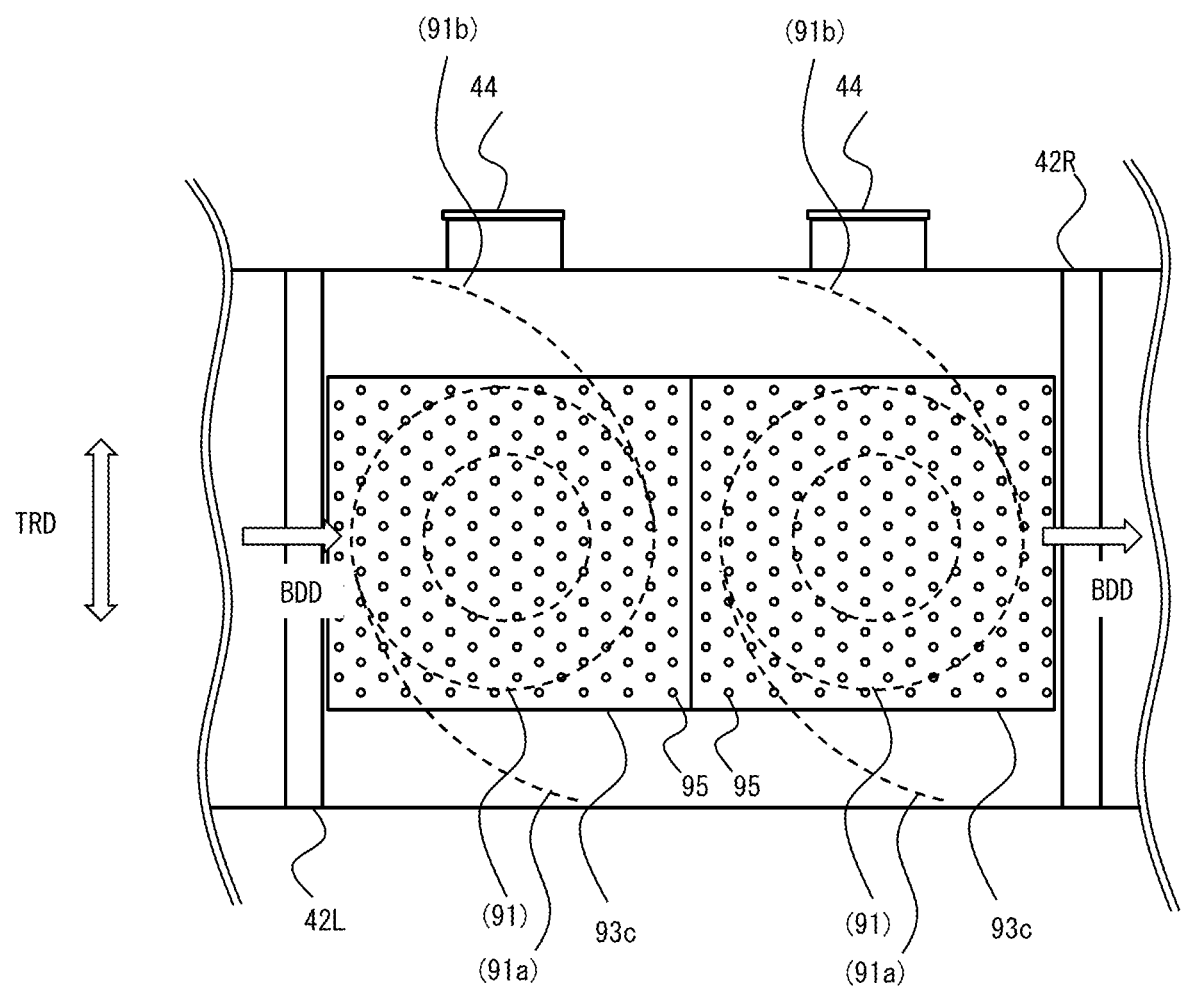
FIG. 5 is a diagram showing the upper part of the cooling zone as viewed from the side of the conveyor when the cooling zone is cut along line 5-5 in FIG. 2.
Figure 6:
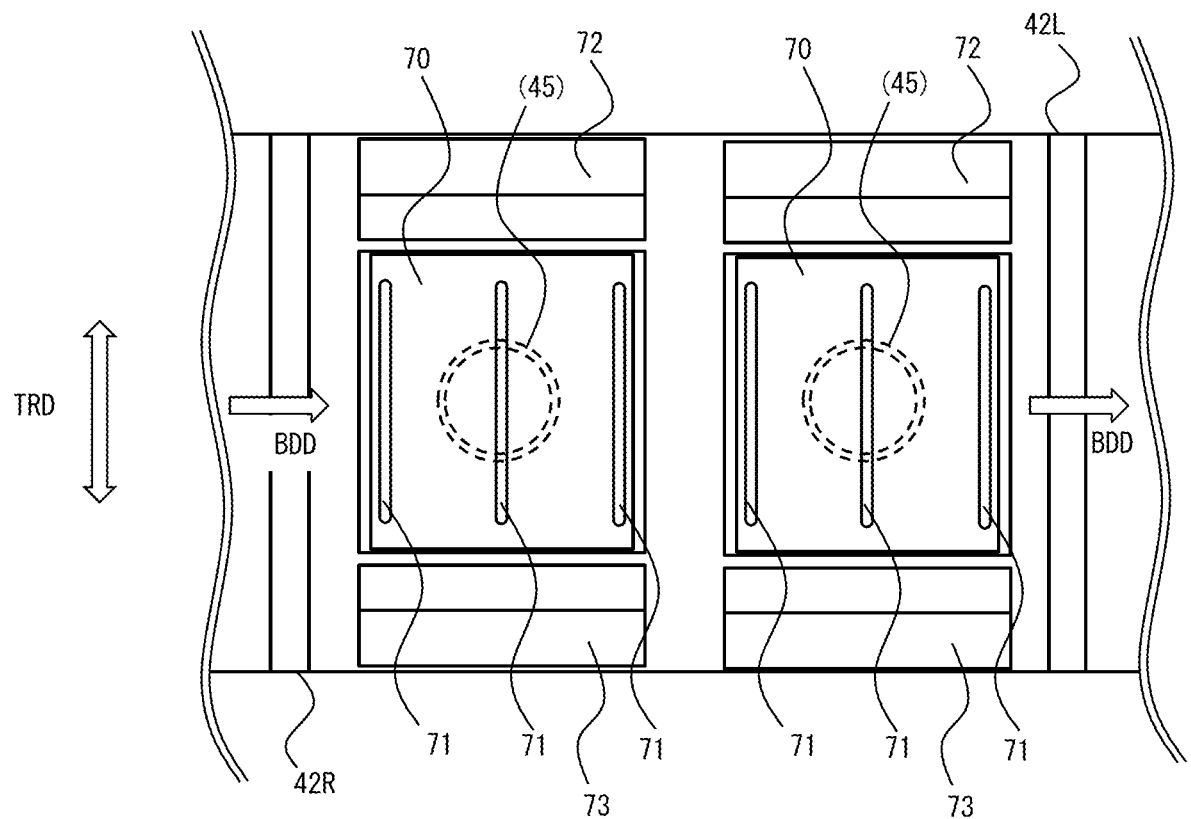
FIG. 6 is a diagram showing a lower part of the cooling zone as viewed from the side of the conveyor when the cooling zone is cut along line 6-6 in FIG. 2.

In the following description, FIGS. 3 to 6 are referred to in order to supplement the description of FIG. 2. FIG. 3 corresponds to a diagram of an upper part of the cooling zone 40 as viewed from the side of a conveyor 10 when the cooling zone 40 is cut along line 3-3 shown in FIG. 2. FIG. 4 corresponds to a diagram obtained when the cooling zone 40A is cut along line 4-4 in FIG. 2 and viewed from the side of the cooling zone 40B (heating zone 30). FIG. 5 corresponds to a diagram of the upper part of the cooling zone 40 as viewed from the side of the conveyor 10 when the cooling zone 40 is cut along line 5-5 shown in FIG. 2. FIG. 6 corresponds to a diagram of a lower part of the cooling zone 40 as viewed from the side of the conveyor 10 when the cooling zone 40 is cut along line 6-6. Note that "the upper part of the cooling zone 40" and "the lower part of the cooling zone 40" are shown relative to the position of the conveyor 10.

In the example shown in FIG. 2, blower units 90 are provided in an upper part of the cooling zone 40A. The blower units 90 are attached to a ceiling wall surface (hereinafter referred to as a "furnace ceiling wall surface) 41 of the cooling zone 40A. The blower units 90 draw in gas for cooling (e.g., nitrogen gas) from lateral sides. The blower units 90 send out the drawn gas downward. Each of the blower units 90 includes a blower fan 91, a fan inlet zone 92, and a fan outlet zone 93.

The blower fan 91 is located below the furnace ceiling wall surface 41. The blower fan 91 draws gas out of the fan inlet zone 92 and sends out the gas to the fan outlet zone 93. In the example shown in FIG. 3, the blower fan 91 includes baffles 91a and 91b. The baffles are provided to horizontally whirl the gas sent out from the blower fan 91 in the fan outlet zone 93. The baffles 91a and 91b are arc-shaped in cross section and approximately equal in size. The baffle 91a extends toward a left-side wall surface (hereinafter referred to as a "furnace left-side wall surface") 42L of the cooling zone 40A from an outer edge of the blower fan 91 indicated by broken lines. On the other hand, the baffle 91b extends toward a right-side wall surface (hereinafter referred to as a "furnace right-side wall surface") 42R of the cooling zone 40A from the outer edge. Note that the "right side" and the "left side" are indicated with respect to the transport direction BDD.

Figure 7:
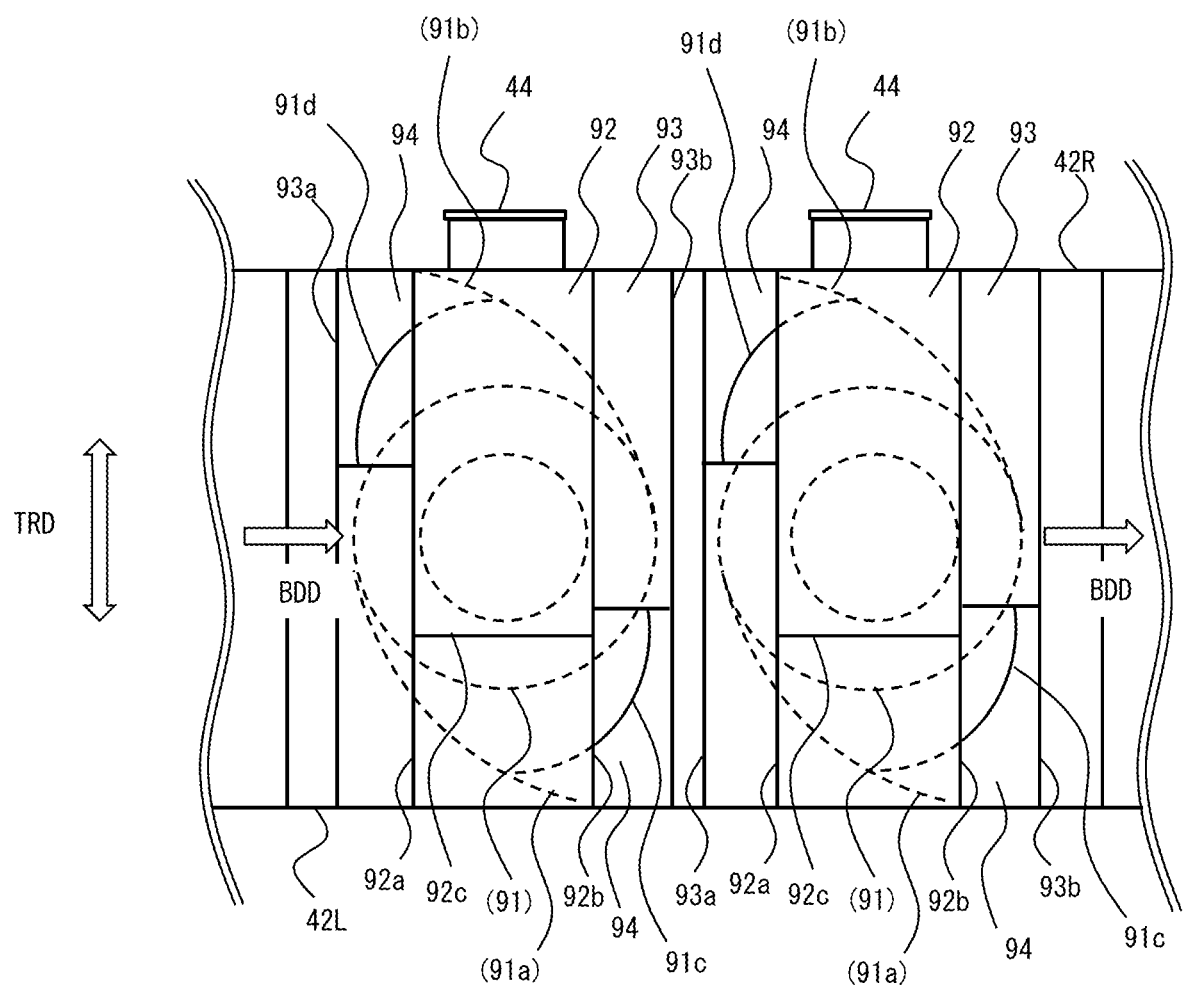
FIG. 7 is a diagram showing another example of a configuration of the upper part of the cooling zone shown in FIG. 3.

Now, another configuration example of the blower fan will be described with reference to FIG. 7. In this example, small baffles are added to the blower fan 91. As shown in FIG. 7, the blower fan 91 includes small baffles 91c and 91d. Purposes of installation of the small baffles are similar to those of the baffle 91a or 91b. The small baffles 91c and 91d are approximately equal in size. However, the small baffles 91a and 91b are smaller in cross section R and vertical size than the baffles 91a and 91b. Therefore, in the example shown in FIG. 7, the gas sent out from the blower fan 91 flows along a surface of the baffle 91a (or baffle 91b) or flows along a surface of the small baffle 91c or (small baffle 91d). The latter flow produces a gas flow whirling in central part of the fan outlet zone 93. The former flow produces a gas flow whirling outside the central part.

Returning to FIG. 2, the description of the cooling zone 40 will be continued. The fan inlet zone 92 is marked off by side wall surfaces (hereinafter referred to as "inlet zone side wall surfaces") 92a and 92b, a bottom wall surface (hereinafter referred to as an "inlet zone bottom wall surface") 92d, and a ceiling wall surface (hereinafter referred to as an "inlet zone ceiling wall surface") 92e (see, in particular, FIGS. 3 and 4). In the example shown in FIG. 4, a partition plate 92c is provided in the fan inlet zone 92. The partition plate 92c faces the furnace right-side wall surface 42R. An installation position of the partition plate 92c is located close to that side face of the blower fan 91 which is farthest from the furnace right-side wall surface 42R. By installing the partition plate 92c in such a position, the gas flowing into the fan inlet zone 92 through an upper vent hole 44 is supplied evenly to a bottom of the blower fan 91. The inlet zone bottom wall surface 92d is inclined downward from the partition plate 92c to the furnace right-side wall surface 42R. Note that the inlet zone bottom wall surface 92d does not necessarily have to be inclined in this way, and an entire area of the inlet zone bottom wall surface 92d may extend in a horizontal direction.

A reason for installing the partition plate 92c is to reduce the area of a wall surface placed in contact, in the fan inlet zone 92, with the gas flowing in through the upper vent hole 44, and thereby reduce the time required for maintenance including cleaning of the wall surface. Therefore, from a viewpoint other than maintenance efficiency, the partition plate 92c does not need to be provided. In that case, the inlet zone bottom wall surface 92d is connected to the furnace left-side wall surface 42L and is inclined downward therefrom to the furnace right-side wall surface 42R. The inlet zone bottom wall surface 92d becomes level in a location close to the furnace right-side wall surface 42R and is connected to the furnace right-side wall surface 42R.

The fan outlet zone 93 is provided surrounding the fan inlet zone 92. As shown in FIGS. 3 and 4, the fan outlet zone 93 is marked off by side wall surfaces (hereinafter referred to as "outlet zone side wall surfaces") 93a and 93b, a bottom wall surface (hereinafter referred to as an "outlet zone bottom wall surface) 93c, the furnace ceiling wall surface 41, and the furnace right-side wall surface 42R. The board passage zone 40a described above is a space formed below the outlet zone bottom wall surface 93c.

A gas outlet 94 shown in FIG. 3 corresponds to the fan outlet zone 93 in the cross section. The gas outlet 94 is configured to cause the gas whirling in the horizontal direction along a surface of the baffle 91a or 91b by being sent out from the blower fan 91 to move downward. The outlet zone bottom wall surface 93c is located below the gas outlet 94. As shown in FIG. 5, a large number of vent holes 95 are formed at equal intervals in the outlet zone bottom wall surface 93c. The gas in the fan outlet zone 93 is blown out through each of the vent holes 95.

As shown in FIG. 4, the outlet zone bottom wall surface 93c has a pent-roof shape that inclines gently downward from central part to the furnace right-side wall surface 42R and the furnace left-side wall surface 42L. A reason for this is that even if flux in a liquid state is produced in the outlet zone bottom wall surface 93c, the flux is expected to move to a position close to the furnace right-side wall surface 42R or the furnace left-side wall surface 42L. When the flux moves in this way, the flux is kept from dripping off the central part located right above the circuit board CB. Note that the shape of the outlet zone bottom wall surface 93c is not limited to this, and another shape may be used.

As shown in FIGS. 3 and 4, the upper vent hole 44 is provided in the furnace right-side wall surface 42R. A lower vent hole 45 is provided in a bottom wall surface (hereinafter referred to as a "furnace bottom wall surface") 43 of the cooling zone 40A. The lower vent hole 45 is connected with one end of an external channel 46. The other end of the external channel 46 is connected with the upper vent hole 44. That is, the upper vent hole 44 and the lower vent hole 45 are interconnected via the external channel 46.

In the board passage zone 40a, a lower opening 47 is provided between the conveyor 10 and the lower vent hole 45. The lower opening 47 is a space connecting the board passage zone 40a and the lower vent hole 45 with each other. A heat exchanger 60 is provided in the lower opening 47. The heat exchanger 60 exchanges heat with gas passing therethrough and thereby cools the gas. Details of a configuration example centered around the heat exchanger 60 will be described in Item 2-2.

As shown in FIG. 4, a ventilation plate 70 is provided below the conveyor 10 and above the heat exchanger 60. The ventilation plate 70 is made up of a flat metal plate. As shown in FIG. 6, three slits 71 are formed at equal intervals in the ventilation plate 70. A longitudinal direction of the slits 71 is orthogonal to the transport direction BDD. That is, the slits 71 are formed in a direction (hereinafter also referred to as a "transverse direction TRD") orthogonal to the transport direction BDD. Note that the total number of slits 71 is not limited to the example of FIG. 6. That is, the total number of slits 71 may be less than or more than three. Also, a formation direction of the slits 71 may be a direction parallel to the transport direction BDD.

As shown in FIG. 4, a bypass channel 72 that bypasses the location of the rail 11L is provided on a lateral side of the rail 11L. The bypass channel 72 inclines an inlet port 72a located above the rail 11L, a discharge port 72b located below the ventilation plate 70, and a bend 72c. Gas above the rail 11L flows into the inlet port 72a and is discharged from the discharge port 72b. The bend 72c bends from inside to outside the rail 11L (to the side of the furnace left-side wall surface 42L) at the position of the rail 11L.

A bypass channel 73 having the same configuration as the bypass channel 72 is provided on a lateral side of the rail 11R. An inlet port 73a of the bypass channel 73 faces the inlet port 72a. A discharge port 73b of the bypass channel 73 faces the discharge port 72b. A bend 73c of the bypass channel 73 bends to outside the rail 11R (to the side of the furnace right-side wall surface 42R) at the position of the rail 11R.

The bypass channels 72 and 73 have a certain width in the transport direction BDD. As shown in FIG. 6, the width of the bypass channels in the transport direction BDD is generally equal to the width of the ventilation plate 70 in the transport direction BDD. Also, as can be seen from FIG. 6, the width of the ventilation plate 70 in the transverse direction TRD is generally equal to the distance between the bypass channels 72 and 73. Actually, there is a gap between the bypass channel 72 or 73 and the ventilation plate 70, and the gap is closed by a support plate provided below the ventilation plate 70. In this arrangement, the ventilation plate 70 is provided in a space formed between the bypass channels 72 and 73. As the ventilation plate 70 is provided at this position, the movement of gas in an up-and-down direction of the ventilation plate 70 is restricted by movement through the slits 71.

As shown in FIG. 4, the external channel 46 bifurcates at a halfway point. Specifically, the external channel 46 bifurcates directly below the lower vent hole 45. A branch channel 49 extends from a branch point 48. A terminal end of the branch channel 49 is connected to a connector 81 of a recovery unit 80. Flux FX in a liquid state is stored in a storage 82 of the recovery unit 80. The entire storage 82 is located below the branch point 48. A channel connecting the branch point 48 and the storage 82 with each other (i.e., the branch channel 49 and the connector 81) inclines downward from the branch point 48 to the storage 82.

2-2. Configuration Example Centered Around Heat Exchanger

Figure 8:
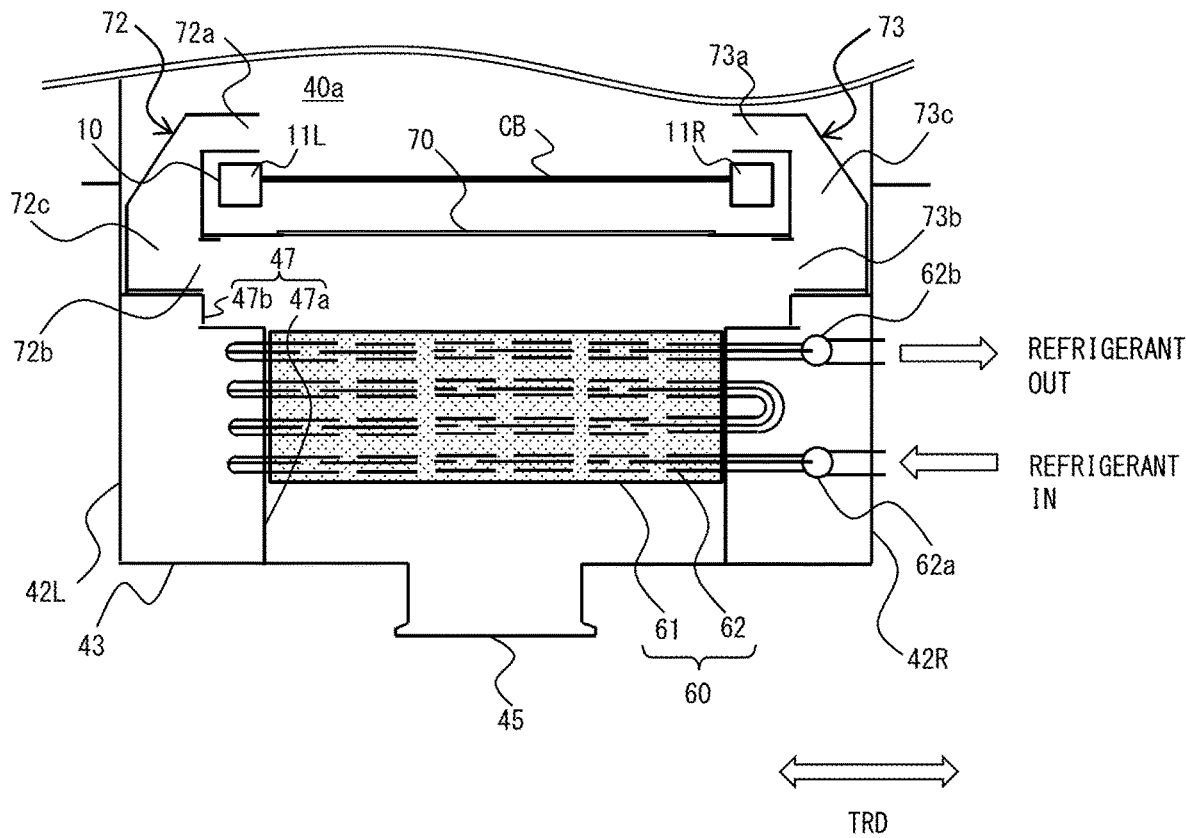
FIG. 8 is a diagram showing a configuration example centered around a heat exchanger shown in FIG. 2.

FIG. 8 is a diagram showing a configuration example centered around the heat exchanger 60 shown in FIG. 2. In the example shown in FIG. 8, the heat exchanger 60 includes a main body 61 and a refrigerant channel 62. The main body 61 has an internal space, in which the refrigerant channel 62 is placed. The refrigerant channel 62 is provided being folded up by turning between opposite side faces of the main body 61. The total number of refrigerant channels 62 may be either one or more than one.

Refrigerant (e.g., cooling water) supplied from outside the heat exchanger 60 circulates through the refrigerant channel 62. A supply port 62a of the refrigerant channel 62 is provided in lower part of the heat exchanger 60 and a discharge port 62b of the refrigerant channel 62 is provided in upper part of the heat exchanger 60. This results in formation of a refrigerant flow moving from below and above in the main body 61 by turning between opposite side faces of the main body 61.

In the example shown in FIG. 8, the lower opening 47 is made up of a small opening 47a that houses the main body 61 and a large opening 47b that has a larger diameter than the small opening 47a. The width of the large opening 47b is generally equal to the distance between the bends 72c and 73c. When gas in the bend 72c or 73c is discharged through the discharge port 72b or 73b, the discharged gas flows in the transverse direction TRD at the position of the large opening 47b.

The heat exchanger 60 is detachably mounted in the lower opening 47. The heat exchanger 60 is connected to the furnace right-side wall surface 42R via a connection unit (not shown). Consequently, when the heat exchanger 60 is removed together with the connection unit, the heat exchanger 60 is separated from the cooling zone 40.

2-3. Cooling Operation in Cooling Zone

Figure 9:
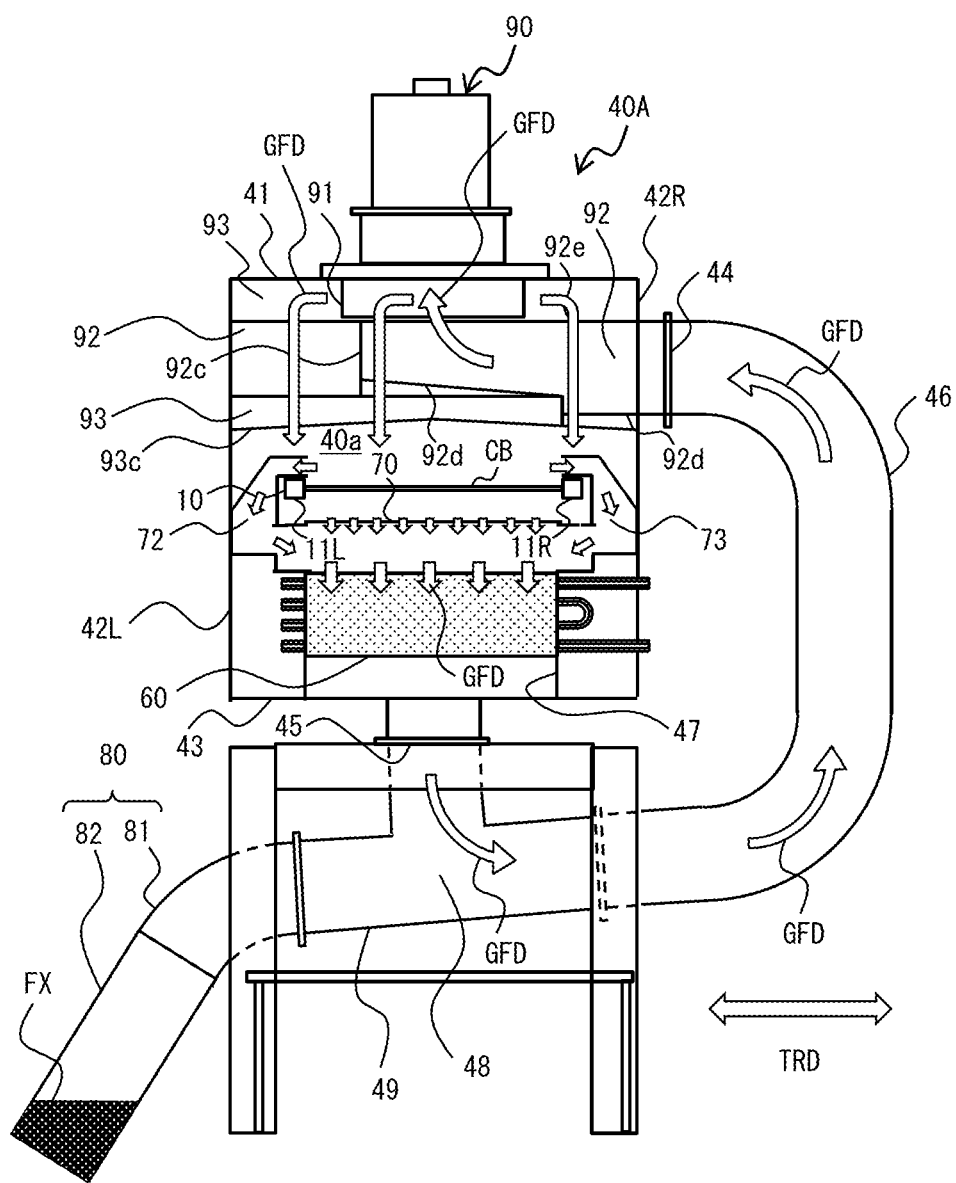
FIG. 9 is a diagram explaining flows of gas in the cooling zone shown in FIG. 2.
Figure 10:
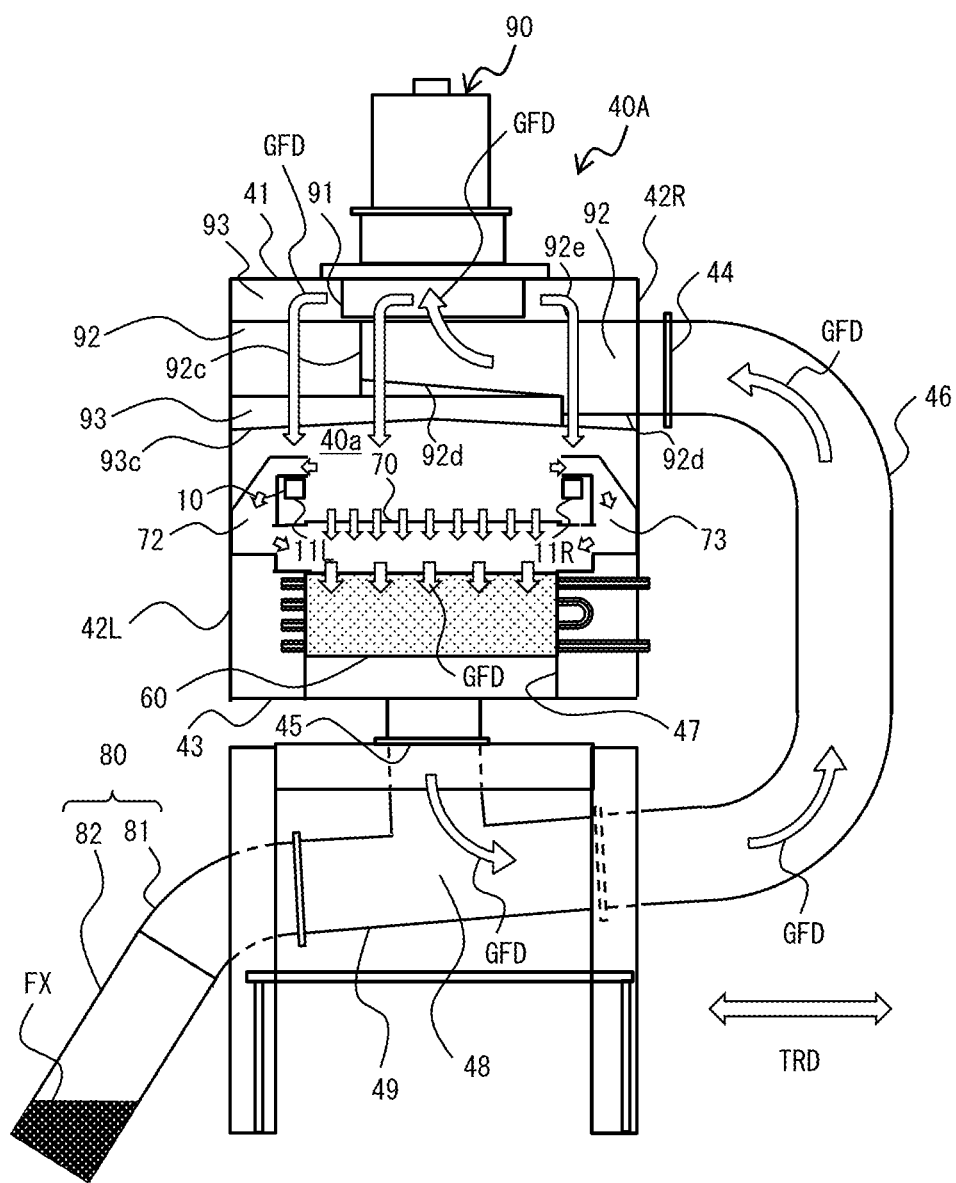
FIG. 10 is a diagram explaining flows of gas in the cooling zone shown in FIG. 2.

FIGS. 9 and 10 are diagrams explaining flows of gas in the cooling zone 40. Note that FIGS. 9 and 10 correspond to diagrams obtained when the cooling zone 40A is cut at the same position as in FIG. 4 and viewed from the side of the cooling zone 40B. A difference between FIGS. 9 and 10 lies in the presence or absence of a circuit board CB. That is, a circuit board CB is illustrated in FIG. 9 and no circuit board CB is illustrated in FIG. 10. The situation shown in FIG. 10 is typically observed when two or more circuit boards are cooled while being transported successively.

Arrows "GFD" in FIGS. 9 and 10 indicate directions of gas flows produced in the cooling zone 40 when the blower unit 90 operates. The flows are described concretely as follows. That is, when the blower unit 90 is operated, the gas in the external channel 46 flows into the fan inlet zone 92 through the upper vent hole 44. The gas flowing into the fan inlet zone 92 is sucked up by the blower fan 91 and sent out to the fan outlet zone 93. The gas sent out to the fan outlet zone 93 flows through the fan outlet zone 93 by flowing outside the fan inlet zone 92 and moves to the outlet zone bottom wall surface 93c. The series of blowing operations of the blower unit 90 causes an orientation of the gas flowing into the blower unit 90 through the furnace right-side wall surface 42R to be changed in the blower unit 90 and causes the gas to be sent out from the blower unit 90 by being orientated in a direction moving from above to below the cooling zone 40A.

The gas reaching the outlet zone bottom wall surface 93c flows into the board passage zone 40a through the vent holes 95 (see FIG. 5). As already described, the vent holes 95 are formed at equal intervals in the outlet zone bottom wall surface 93c. Consequently, the flow rate of the gas flowing into the board passage zone 40a through the vent holes 95 is generally uniform in a plane direction of the outlet zone bottom wall surface 93c.

In the example shown in FIG. 9, the gas flowing into the board passage zone 40a through the vent holes 95 is blown onto the circuit board CB, thereby cooling the circuit board CB. The gas blown onto the circuit board CB changes orientation on the circuit board CB and flows around the circuit board CB. The gas flowing around the circuit board CB is broadly divided into gas flowing in the transport direction BDD and gas flowing in the transverse direction TRD.

The gas flowing in the transport direction BDD moves to the ventilation plate 70 by slipping through the sides of the circuit board CB. The gas reaching the ventilation plate 70 moves to the lower opening 47 through the slits 71. The flow of gas before passing through the slits 71 is adjusted while passing through the slits 71. Consequently, below the slits 71, the direction (i.e., the direction from top to bottom) of the gas flow becomes constant. After passing through the slits 71, the gas reaches the large opening 47b.

The gas flowing in the transverse direction TRD flows into the bend 72c (or the bend 73c) through the inlet port 72a (or the inlet port 73a) and is discharged through the discharge port 72b (or the discharge port 73b). In the bend 72c (or the bend 73c), the flow of gas is adjusted. Consequently, the gas discharged through the discharge port 72b (or the discharge port 73b) reaches the large opening 47b by spreading in the transverse direction TRD.

The gas reaching the large opening 47b is cooled by coming into contact with a surface of the refrigerant channel 62 when passing through the heat exchanger 60 (the internal space of the main body 61). The cooled gas flows through the external channel 46 as a result of draw-in operation of the blower unit 90 and flows into the blower unit 90 (fan inlet zone 92) through the upper vent hole 44. Thus, the gas blown out from the outlet zone bottom wall surface 93c (vent holes 95) by delivery operation of the blower unit 90 is low in temperature, and consequently the circuit board CB is cooled.

In the example shown in FIG. 10, most of the gas flowing into the board passage zone 40a through the vent holes 95 moves as it is to the ventilation plate 70. The flow of gas reaching the ventilation plate 70 is as described in FIG. 9. Part of the gas flowing into the board passage zone 40a through the vent holes 95 reaches the large opening 47b through the bypass channel 72 or 73. As can be seen when FIGS. 9 and 10 are compared, the direction of the gas flow flowing into the board passage zone 40a through the vent holes 95 is constant regardless of the presence or absence of a circuit board CB above the heat exchanger 60.

3. Effects

Oxygen gas may flow into the board passage zone 40a from outside the cooling zone 40. The oxygen gas might cause oxidation of the soldering area on the circuit board CB. Also, if the flow of gas existing between the rails 11L and 11R is disturbed, during cooling of the circuit board CB, the soldering area and the like will be easily oxidized by oxygen mixed into the flow of gas.

In this respect, with the configuration of the reflow furnace according to the embodiment, when a circuit board CB is present above the heat exchanger 60, much of the gas above the conveyor 10 can be sent to the large opening 47b through the bypass channels 72 and 73. On the other hand, when no circuit board CB is present above the heat exchanger 60, much of the gas above the conveyor 10 can be sent to the large opening 47b through the slits 71. This makes it possible to always prevent the flow of gas existing between the rails 11L and 11R from being disturbed.

In particular, with the configuration of the reflow furnace according to the embodiment, since the discharge ports 72b and 73b are located below the ventilation plate 70 and above the lower opening 47, length of the bypass channels 72 and 73 can be shortened. By shortening the length of the bypass channels 72 and 73, it is possible to supply gas to the heat exchanger 60 while keeping the gas flowing through the bypass channels 72 and 73 from being cooled by the inner wall surfaces. This makes it possible to cool the gas passing through the bypass channels 72 and 73 reliably in the heat exchanger 60 and thereby efficiently recover the flux contained in the gas downstream of the heat exchanger 60.

The gas discharged to below the ventilation plate 70 merges with the gas passing through the slits 71. This can cause disturbances of gas below the ventilation plate 70. However, because the disturbances are blocked by the ventilation plate 70, the gas existing between the rails 11L and 11R is rarely disturbed. Thus, with the configuration of the reflow furnace according to the embodiment, it is possible to cool the circuit boards CB while curbing disturbances in the flow of gas existing between the rails 11L and 11R.

As already described, the spacing between the rails 11L and 11R is adjusted according to the size of the circuit boards CB. That is, when circuit boards CB having a large width in the transverse direction TRD are cooled, the spacing between the rails 11L and 11R is increased; and when circuit boards CB having a small width are cooled, the spacing is reduced. Consequently, if the slits 71 are formed in parallel to the transport direction BDD, disturbances in the flow of gas may increase around the slits 71 depending on the spacing between the rails 11L and 11R. In this respect, with the configuration of the reflow furnace according to the embodiment, since the slits 71 are formed in the transverse direction TRD, occurrence of troubles with adjustment of the spacing between the rails 11L and 11R can be reduced compared to when the slits 71 are formed in parallel to the transport direction BDD.

Also, the reflow furnace according to the embodiment allows the orientation of the gas flowing into the blower unit 90 through the furnace right-side wall surface 42R to be changed in the blower unit 90 and thereby allows the gas sent out from the blower unit 90 to be orientated in the direction moving from above to below the cooling zone 40.

This makes it possible to stabilize the flow of gas existing between the rails 11L and 11R.

Also, with the reflow furnace according to the embodiment, since the vent holes 95 are formed at equal intervals in the outlet zone bottom wall surface 93c, the gas flowing into the blower unit 90 can be sent out to the cooling zone 40 by blowing out uniformly through the vent holes 95. This makes it possible to further stabilize the flow of gas existing between the pair of rails 11L and 11R.

Also, with the reflow furnace according to the embodiment, below the lower vent hole 45, flux in a liquid state can be caused to flow through the branch point 48, the branch channel 49, and the connector 81 in this order. Thus, outside the cooling zone 40 (i.e., in the recovery unit 80), the flux can be recovered efficiently.

Also, with the reflow furnace according to the embodiment, since the channel connecting the branch point 48 and the storage 82 with each other inclines downward from the branch point 48 to the storage 82, the flux recovery efficiency of the recovery unit 80 can be improved.

4. Reference Example

Another disclosure devised by the present inventors in the process of conducting studies for the present disclosure will be disclosed below as a reference example. Note that the same components as those of the above embodiment are denoted by the same reference signs as the corresponding components of the above embodiment, and description thereof will be omitted.

4-1. Configuration Example of Cooling Zone

Figure 11:
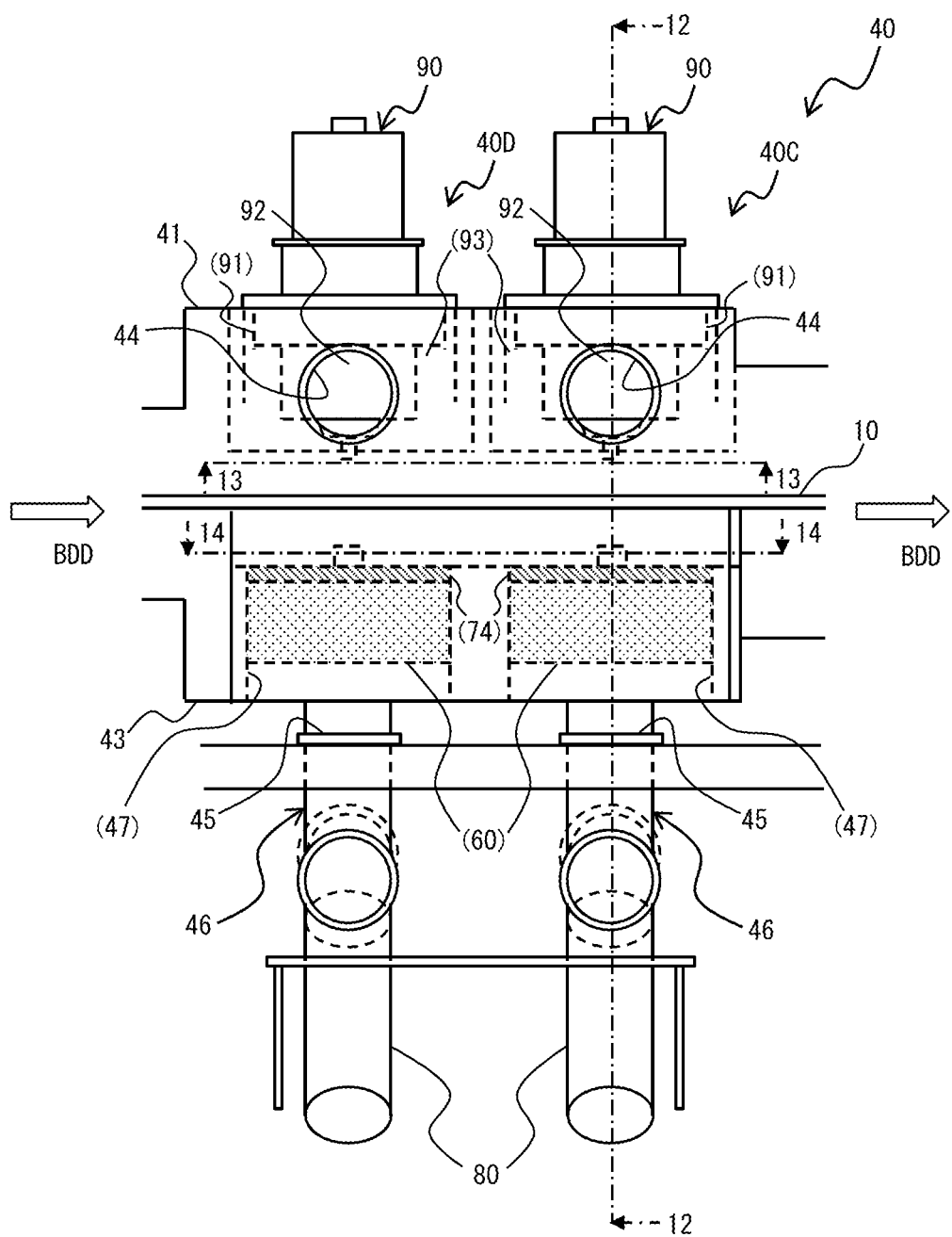
FIG. 11 is a diagram showing an example of major components of a cooling zone in a soldering apparatus according to a reference example of the present disclosure.

FIG. 11 is a diagram showing an example of major components of a cooling zone in a soldering apparatus according to a reference example. As shown in FIG. 11, the cooling zone 40 includes a cooling zone 40C and a cooling zone 40D. The cooling zone 40C and the cooling zone 40D are basically equal in configuration. Therefore, the cooling zone 40C will be described below representatively, and description of the cooling zone 40D will be omitted.

Figure 12:
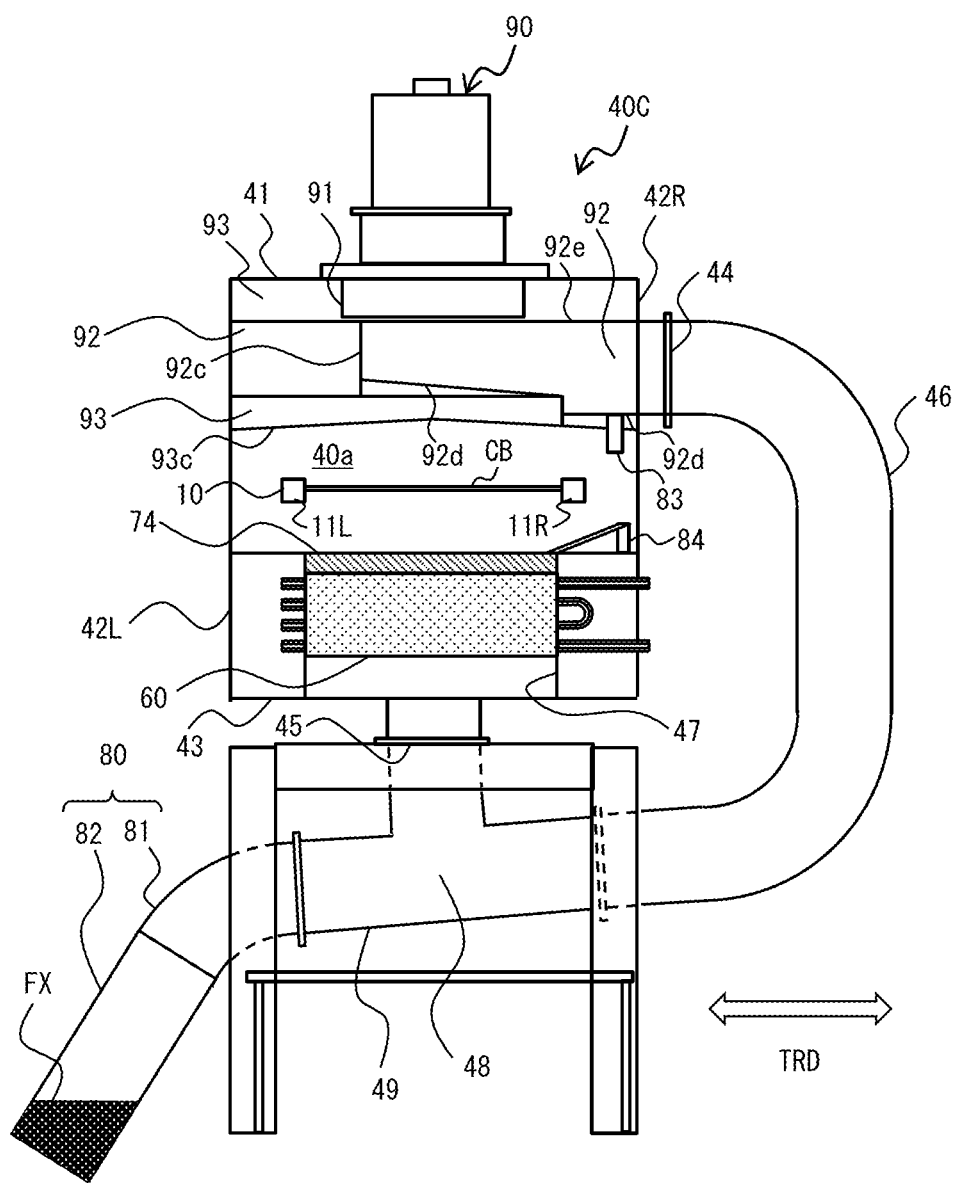
FIG. 12 is a diagram showing the upper part of a cooling zone as viewed from the side of a heating zone when the cooling zone is cut along line 12-12 in FIG. 11.
Figure 13:
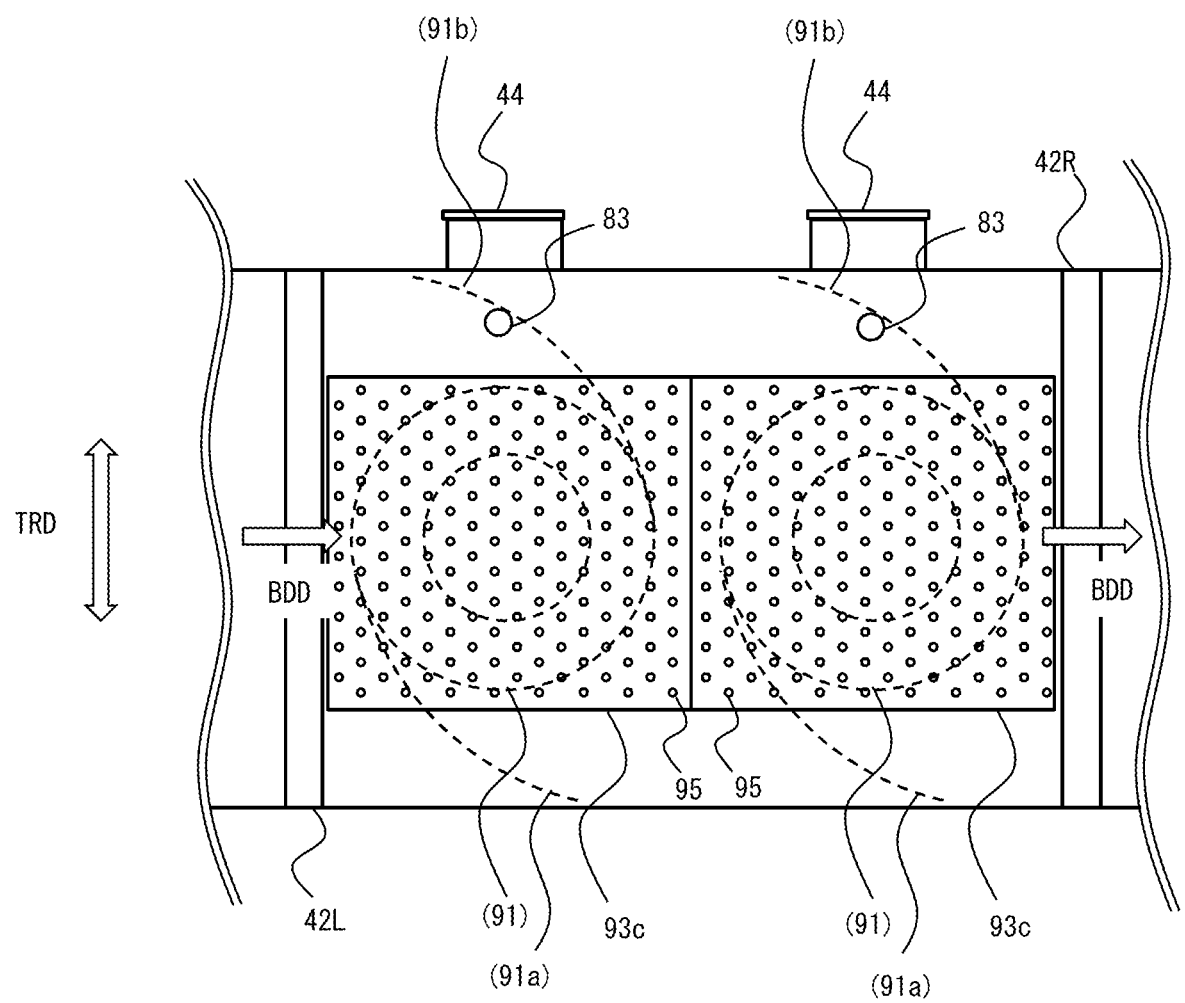
FIG. 13 is a diagram showing the upper part of the cooling zone as viewed from the side of a conveyor when the cooling zone is cut along line 13-13 in FIG. 11.
Figure 14:
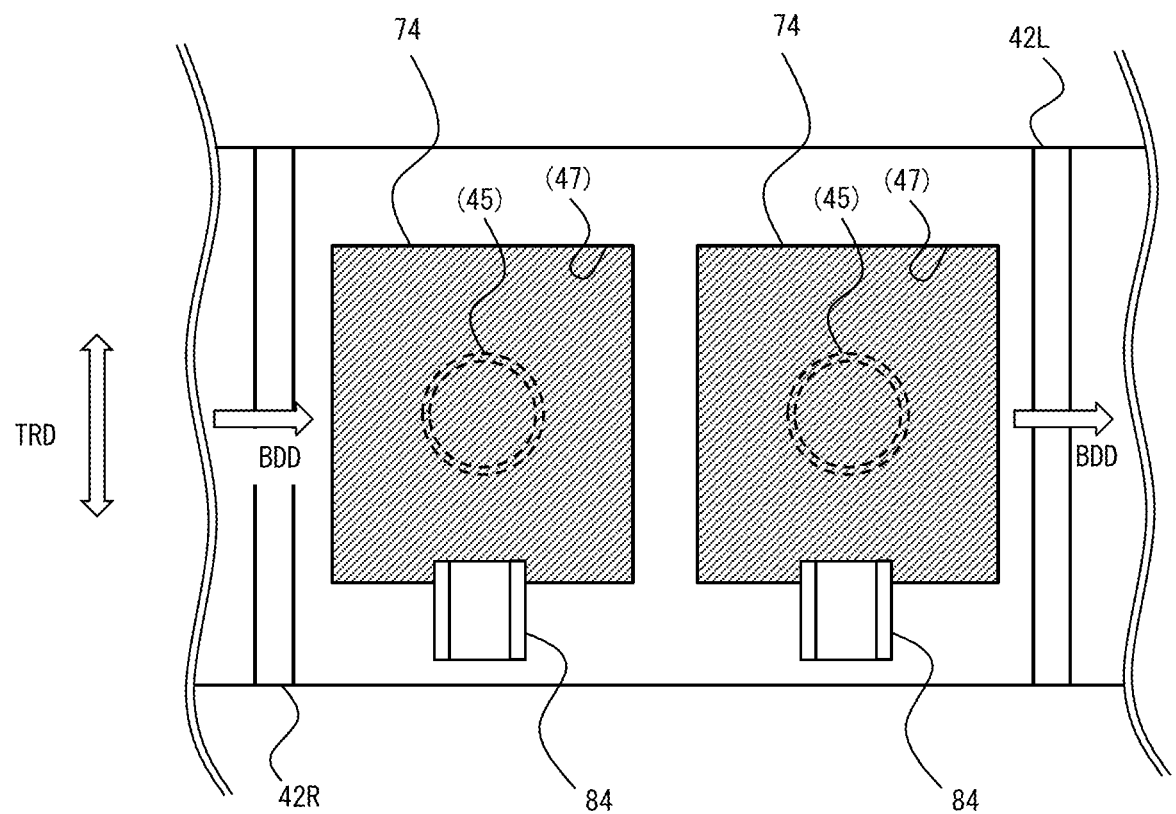
FIG. 14 is a diagram showing the lower part of the cooling zone as viewed from the side of the conveyor when the cooling zone is cut along line 14-14 in FIG. 11.

In the following description, FIGS. 12 to 15 are referred to in order to supplement the description of FIG. 11. FIG. 12 corresponds to a diagram obtained when the cooling zone 40C is cut along line 12-12 in FIG. 11 and viewed from the side of the cooling zone 40D (heating zone 30). FIG. 13 corresponds to a diagram obtained when the cooling zone 40 is cut along line 13-13 shown in FIG. 11 and the upper part of the cooling zone 40 is viewed from the side of the conveyor 10. FIG. 14 corresponds to a diagram obtained when the cooling zone 40 is cut along line 14-14 shown in FIG. 11 and the lower part of the cooling zone 40 is viewed from the side of the conveyor 10.

In the reference example, the blower units 90 are provided in the upper part of the cooling zone 40. The configuration of the blower unit 90 and its surroundings is the same as that of the embodiment.

As shown in FIG. 12, according to the reference example, the inlet zone bottom wall surface 92d becomes level in a location close to the furnace right-side wall surface 42R and is connected to the furnace right-side wall surface 42R. So far, the configuration is the same as that of the embodiment. According to the reference example, one end of a drain pipe 83 is connected to the level area. The drain pipe 83 discharges liquid-state flux produced in the fan inlet zone 92, from the fan inlet zone 92. A central axis of the drain pipe 83 extends in a vertical direction. The other end of the drain pipe 83 reaches the board passage zone 40a.

Below the drain pipe 83 in the board passage zone 40a, a drain slider 84 is detachably attached to a wall surface that makes up the board passage zone 40a. The drain slider 84 has a function to guide flux dripping off the drain pipe 83, to the lower opening 47.

As shown in FIG. 12, the heat exchanger 60 is provided in the lower opening 47. So far, the configuration is the same as that of the embodiment. According to the reference example, a filter 74 is provided on the heat exchanger 60. The filter 74 is made up of a porous metal body having a three-dimensional network structure. The filter 74 has such a sectional shape (quadrangular in the example shown in FIG. 14) that can be fitted in the lower opening 47. Details of a configuration example centered around the heat exchanger 60 will be described in Item 4-2.

4-2. Configuration Example Centered Around Heat Exchanger

Figure 15:
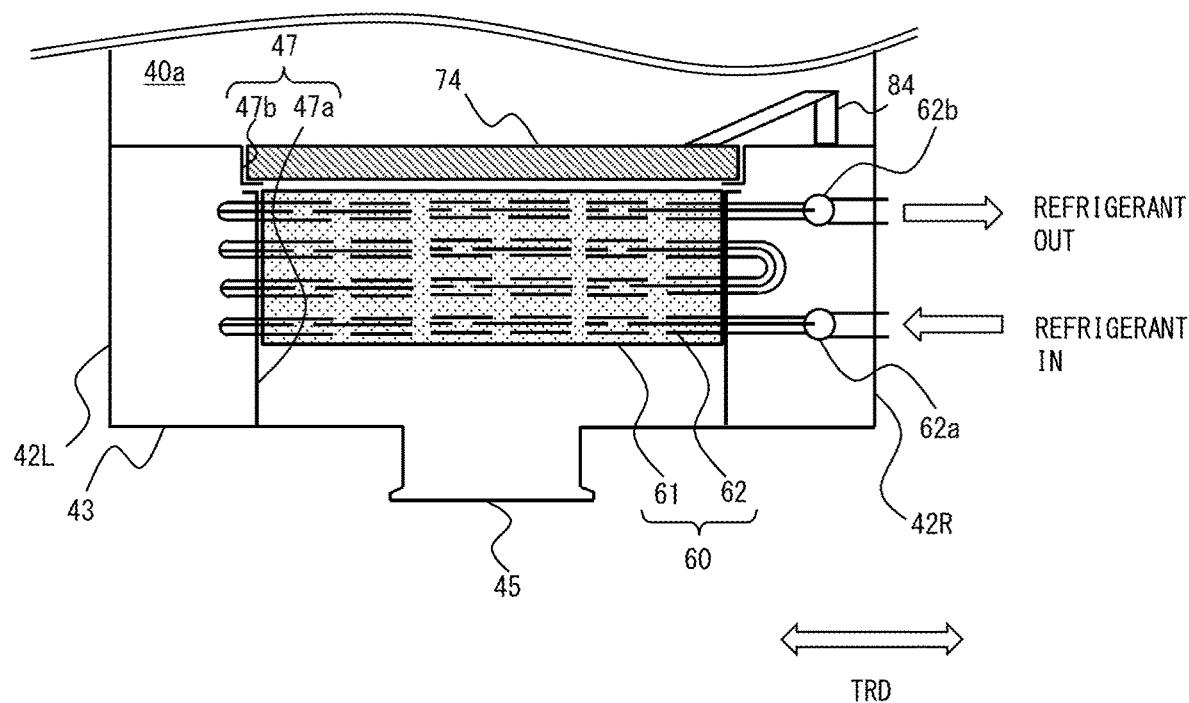
FIG. 15 is a diagram showing a configuration example centered around a heat exchanger shown in FIG. 11.

FIG. 15 is a diagram showing a configuration example centered around the heat exchanger 60 shown in FIG. 11. In the example shown in FIG. 15, the heat exchanger 60 includes a main body 61 and a refrigerant channel 62. Also, in the example shown in FIG. 15, the lower opening 47 includes a small opening 47a and a large opening 47b. So far, the configuration is the same as that of the embodiment. According to the reference example, the filter 74 is provided in the large opening 47b. When the filter 74 is provided in the large opening 47b, an upper surface of the main body 61 is covered with the filter 74. As the upper surface of the main body 61 is covered with the filter 74, the gas in the cooling zone 40A flows into the internal space of the main body 61 always through the filter 74. The filter 74 is detachably mounted in the lower opening 47.

4-3. Cooling Operation in Cooling Zone

Figure 16:
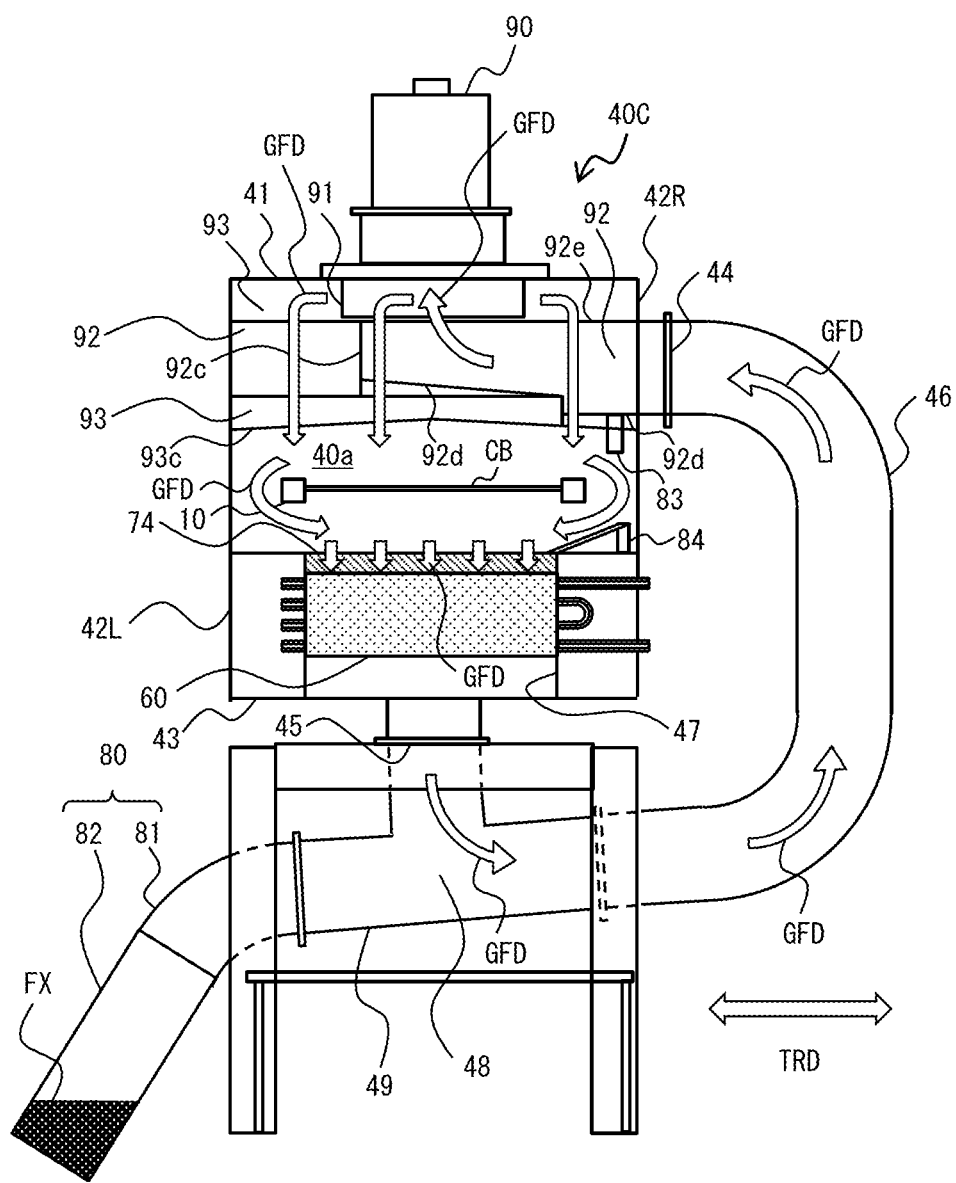
FIG. 16 is a diagram explaining flows of gas in the cooling zone shown in FIG. 11.

FIG. 16 is a diagram explaining flows of gas in the cooling zone 40 shown in FIG. 11. Note that FIG. 16 corresponds to a diagram obtained when the cooling zone 40C is cut at the same position as in FIG. 12 and viewed from the side of the cooling zone 40D.

When the blower unit 90 is operated, the gas in the external channel 46 flows into the board passage zone 40a through the vent holes 95 (see FIG. 5). The gas flowing into the board passage zone 40a through the vent holes 95 reaches an upper surface of the filter 74 by flowing from above to below the conveyor 10 while cooling the circuit boards CB.

The gas reaching the upper surface of the filter 74 flows into the filter 74. Disturbances of gas before flowing into the filter 74 are smoothed out (rectification action of the filter 74) while the gas is flowing through the filter 74. Consequently, below a lower surface of the filter 74, the direction (i.e., the direction from top to bottom) of the gas flow becomes constant. Also, the rectification action leads to a uniform flow rate of the gas below the lower surface of the filter 74 in the horizontal direction.

The gas flowing out of the lower surface of the filter 74 is cooled by coming into contact with a surface of the refrigerant channel 62 when passing through the heat exchanger 60 (the internal space of the main body 61). The cooled gas flows through the external channel 46 as a result of draw-in operation of the blower unit 90 and flows into the blower unit 90 (fan inlet zone 92) through the upper vent hole 44. Thus, the gas blown out from the outlet zone bottom wall surface 93c (vent holes 95) by delivery operation of the blower unit 90 is low in temperature, and consequently the circuit board CB is cooled.

REFERENCE SIGNS LIST

1 Reflow furnace (soldering apparatus)
10 Conveyor
11L, 11R Rail
40, 40A, 40B Cooling zone
40a Board passage zone
41 Furnace ceiling wall surface
42L Furnace left-side wall surface
42R Furnace right-side wall surface
43 Furnace bottom wall surface
44 Upper vent hole
45 Lower vent hole
46 External channel
47 Lower opening
47a Small opening
47b Large opening
48 Branch point
49 Branch channel
60 Heat exchanger
61 Main body
62 Refrigerant channel
62a Supply port
62b Discharge port
70 Ventilation plate
71 Slit
72, 73 Bypass channel
72a, 73a Inlet port
72b, 73b Discharge port
74 Filter
80 Recovery unit
81 Connector
82 Storage
83 Drain pipe
84 Drain slider
90 Blower unit
91 Blower fan
92 Fan inlet zone
92a, 92b Inlet zone side wall surface
92c Partition plate
92d Inlet zone bottom wall surface
92e Inlet zone ceiling wall surface
93 Fan outlet zone
93a, 93b Outlet zone side wall surface
93c Outlet zone bottom wall surface
95 Vent hole
CB Circuit board
FX Flux
BDD Transport direction
GFD Gas flow direction

The invention claimed is:

1. A soldering apparatus comprising:
a cooling zone configured to cool a board subjected to a soldering process;
an upper vent hole provided above a pair of rails configured to transport the board in the cooling zone;
a lower vent hole provided below the pair of rails in the cooling zone;
an external channel that connects the upper and lower vent holes with each other outside the cooling zone;
a blower unit that is communicated with the upper vent hole, and configured to cause gas in the external channel to flow through the upper vent hole, the cooling zone, and the lower vent hole in order and return to the external channel;
a heat exchanger provided in a lower opening linked to the lower vent hole below the pair of rails, and configured to cool gas passing through the lower opening;
a pair of bypass channels provided in parallel to the pair of rails on lateral sides of the pair of rails, and configured to draw in gas above the pair of rails through inlet ports, discharge the gas through discharge ports while bypassing locations of the pair of rails, and thereby deliver the gas to the lower opening; and
a ventilation plate provided in a space formed between the pair of bypass channels below the pair of rails, and provided with a slit used to send gas below the pair of rails to the lower opening.

2. The soldering apparatus according to claim 1, wherein:
the inlet ports are located above the pair of rails;
the discharge ports are located below the pair of rails;
the pair of bypass channels each include a respective one of the inlet ports, a respective one of the discharge ports, and a bend, the bends bending outward from inside the pair of rails in the locations of the pair of rails; and
the discharge ports are located below the ventilation plate and above the lower opening.

3. The soldering apparatus according to claim 1, wherein:
the inlet ports are located above the pair of rails;
the discharge ports are located below the pair of rails;
the pair of bypass channels each include a respective one of the inlet ports, a respective one of the discharge ports, and a bend, the bends bending outward from inside the pair of rails in the locations of the pair of rails;
one of the inlet ports faces another of the inlet ports; and
one of the discharge ports faces another of the discharge ports.

4. The soldering apparatus according to claim 1, wherein:
a width of the pair of bypass channels in a transport direction of the board is approximately equal to a width of the ventilation plate in the transport direction; and
the slit is formed in a direction orthogonal to the transport direction.

5. The soldering apparatus according to claim 1, wherein:
the upper vent hole is provided in a furnace side wall surface serving as a side wall surface of the cooling zone; and
the blower unit includes:
a blower fan provided on a furnace ceiling wall surface serving as a ceiling wall surface of the cooling zone;
a fan inlet zone extending from the upper vent hole to a wall surface facing the furnace side wall surface, and configured to cause gas to flow toward the blower fan from the upper vent hole; and
a fan outlet zone provided surrounding the fan inlet zone, and configured to cause gas to flow toward the cooling zone from the blower fan.

6. The soldering apparatus according to claim 5, wherein:
an outlet zone bottom wall surface serving as a bottom wall surface of the fan outlet zone faces a board transport surface formed between the pair of rails; and
a large number of vent holes are formed at equal intervals in the outlet zone bottom wall surface.

7. The soldering apparatus according to claim 1, further comprising:
a branch channel branching off from the external channel at a midpoint of the external channel; and a recovery unit connected to the branch channel, and configured to recover flux in a liquid state.

8. The soldering apparatus according to claim 7, wherein:

the recovery unit includes a storage, and a connector connecting the storage to the branch channel;

a branch point of the branch channel in the external channel is located directly below the lower vent hole;

the storage is provided below the branch point; and a channel connecting the branch point and the storage with each other is inclined downward from the branch point to the storage.

* * * * *